US012580577B2

(12) United States Patent
Nagulu et al.

(10) Patent No.: US 12,580,577 B2
(45) Date of Patent: Mar. 17, 2026

(54) SCALING-FRIENDLY, ANALOG CORRELATORS USING CHARGE-BASED MARGIN PROPAGATION

(71) Applicants: Washington University, St. Louis, MO (US); Oregon State University, Corvallis, OR (US)

(72) Inventors: Aravind Nagulu, St. Louis, MO (US); Shantanu Chakrabartty, St. Louis, MO (US); Arun Natarajan, St. Louis, MO (US)

(73) Assignees: Washington University, St. Louis, MO (US); Oregon State University, Corvallis, OR (US)

( * ) Notice: Subject to any disclaimer, the term of this patent is extended or adjusted under 35 U.S.C. 154(b) by 225 days.

(21) Appl. No.: 18/485,939

(22) Filed: Oct. 12, 2023

(65) Prior Publication Data

US 2024/0137035 A1    Apr. 25, 2024
US 2024/0380408 A9    Nov. 14, 2024

Related U.S. Application Data

(60) Provisional application No. 63/379,168, filed on Oct. 12, 2022.

(51) Int. Cl.
*H03M 1/12*          (2006.01)
(52) U.S. Cl.
CPC .................................. *H03M 1/124* (2013.01)
(58) Field of Classification Search
CPC ...... H03M 1/1245; H03M 1/468; H03M 1/12; H03M 1/164; H03M 1/44; H03M 1/002;

H03M 1/1295; H03M 1/34; H03M 1/56; H03M 3/426; H03M 3/458; H03M 1/001; H03M 1/0682; H03M 1/08; H03M 1/0854; H03M 1/0863; H03M 1/1215; H03M 1/1225; H03M 1/129; H03M 1/162;

(Continued)

(56) References Cited

U.S. PATENT DOCUMENTS 6,441,766 B1 *  8/2002  Chuang ................. H03M 1/403
                                                    341/155
7,106,241 B1 *  9/2006  Felder ..................... H03M 3/35
                                                    341/172

(Continued)

FOREIGN PATENT DOCUMENTS

CN          113010213 A     6/2021
CN          113157636 A     7/2021
(Continued)

*Primary Examiner* — Linh V Nguyen
(74) *Attorney, Agent, or Firm* — Armstrong Teasdale LLP

(57)          ABSTRACT

A non-multiply-accumulate (non-MAC) charge-based analog correlator system including a sampler circuit block, an operand generation circuit block, and a margin propagation (MP) correlation computation circuit block is disclosed. The sampler circuit block is configured to sample a plurality of input analog signals. The operand generation circuit block is configured to generate operands based on the sampled plurality of input analog signals, and the margin propagation (MP) correlation computation circuit block is configured to generate correlated output signals based on the operands and using calculations in a charge domain.

19 Claims, 42 Drawing Sheets

(58) Field of Classification Search
CPC .......... H03M 1/167; H03M 1/38; H03M 1/46;
H03M 1/466; H03M 1/742; H03M 1/765;
H03M 3/342; H03M 3/496; H03M 1/06;
H03M 1/0604; H03M 1/0607; H03M
1/0609; H03M 1/0617; H03M 1/0663;
H03M 1/068; H03M 1/0695; H03M
1/0697; H03M 1/0836; H03M 1/0845;
H03M 1/0872; H03M 1/089; H03M
1/1004; H03M 1/1023; H03M 1/121;
H03M 1/1265; H03M 1/144; H03M
1/183; H03M 1/206; H03M 1/36; H03M
1/403; H03M 1/462; H03M 1/502; H03M
1/60; H03M 1/66; H03M 1/662; H03M
1/68; H03M 1/72; H03M 1/74; H03M
1/802; H03M 1/804; H03M 3/00; H03M
3/34; H03M 3/348; H03M 3/35; H03M
3/368; H03M 3/372; H03M 3/424; H03M
3/43; H03M 3/452; H03M 3/454
USPC ........................................ 341/122, 155, 172
See application file for complete search history.

(56) References Cited

U.S. PATENT DOCUMENTS

| | | | | |
|---|---|---|---|---|
| 7,453,389 B1 * | 11/2008 | Vu | ........................ | H03M 1/802 |
| | | | | 341/172 |
| 8,060,810 B2 | 11/2011 | Chakrabartty | | |
| 8,378,864 B2 * | 2/2013 | Zhao | ........................ | H03M 1/06 |
| | | | | 341/172 |
| 8,604,962 B1 * | 12/2013 | Lewyn | ................ | H03M 1/0863 |
| | | | | 341/161 |
| 8,860,599 B1 * | 10/2014 | Lien | ........................ | H03M 1/462 |
| | | | | 341/158 |
| 9,015,504 B2 | 4/2015 | Tran | | |
| 9,280,625 B2 | 3/2016 | Mottaez | | |
| 10,062,450 B1 * | 8/2018 | Moore | ................ | G11C 27/024 |
| 10,340,932 B2 * | 7/2019 | Bandyopadhyay | ... | H03M 3/426 |
| 11,610,104 B1 * | 3/2023 | Far | ......................... | G11C 7/16 |
| 2009/0140802 A1 * | 6/2009 | Kitagawa | ............. | H03M 3/342 |
| | | | | 330/9 |
| 2009/0179699 A1 * | 7/2009 | Higuchi | ............... | H03K 5/2481 |
| | | | | 330/260 |
| 2018/0076780 A1 * | 3/2018 | Wang | ................. | H03F 3/45071 |
| 2022/0012060 A1 | 1/2022 | Fok | | |
| 2022/0206751 A1 | 6/2022 | Jain | | |
| 2022/0263582 A1 | 8/2022 | Ma | | |
| 2023/0093133 A1 * | 3/2023 | Watanabe | .......... | H03M 1/1245 |
| | | | | 341/100 |

FOREIGN PATENT DOCUMENTS

| | | | |
|---|---|---|---|
| WO | 2021120036 A1 | 6/2021 | |
| WO | 2021232949 A1 | 11/2021 | |

* cited by examiner

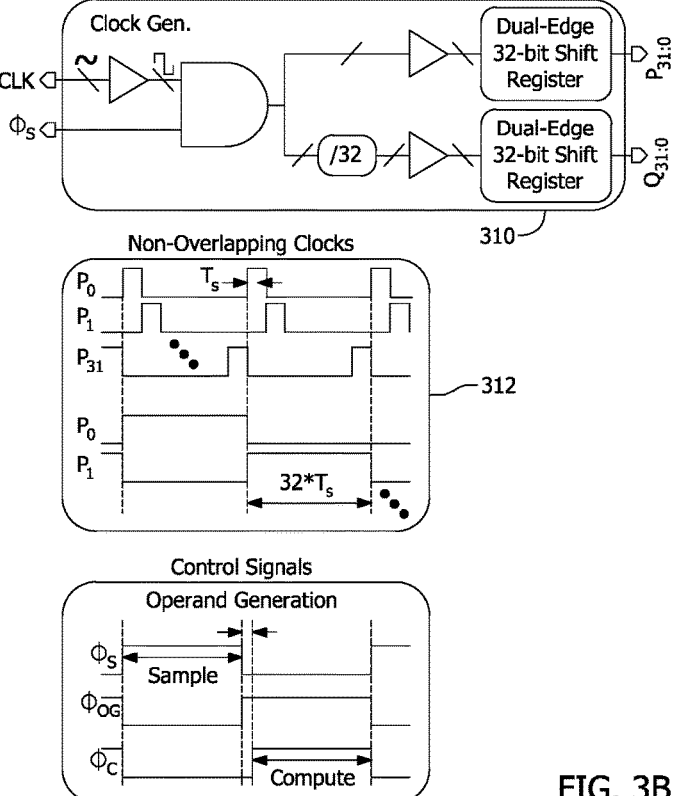
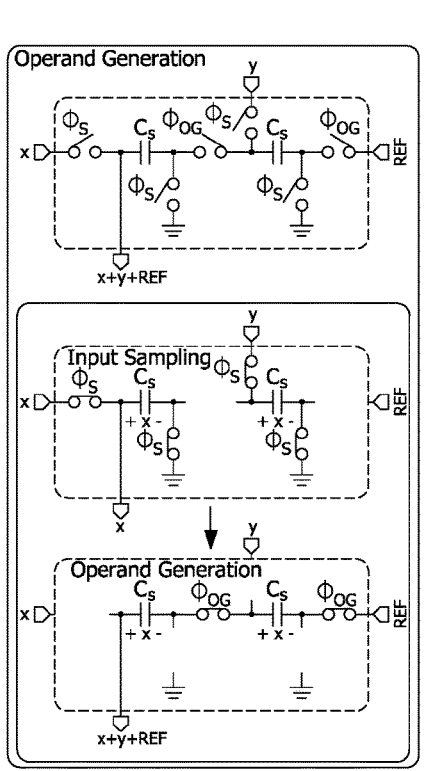
FIG. 3B

400
Measured correlation across longer
sequence lengths
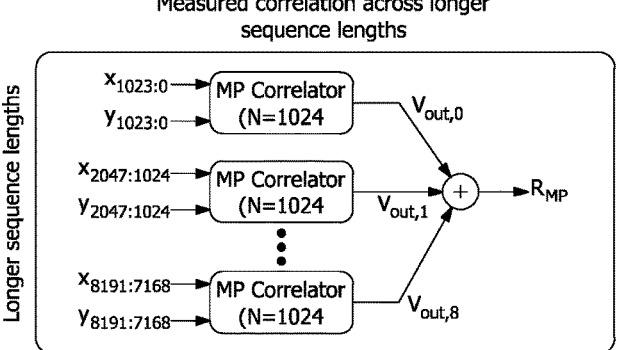
Measured correlation error improves with
sequence lengths; robust to supply variations
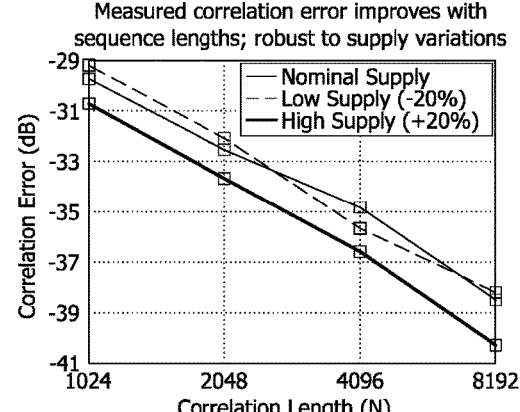
FIG. 4B 600

Performance Compared to SoA Vector Multipliers

| | Y. He ISSCC23 | D. Wang ISSCC22 | L. Fick ISSCC22 | H. Wang JSSC23 | H. Jia JSSC22 | This Work |
|---|---|---|---|---|---|---|
| CMOS Tech. | 28nm | 28nm | 40nm | 22nm | 16nm | 65nm |
| Computing Method | ABS+ADD | OR/AND+ADD | Multiply+ADD | Multiply+ADD | Multiply+ADD | ReLU MP |
| Computing Domain | Digital | Digital | Current | Charge | Charge | Charge |
| CMOS Tech. | 0.54:0.9 | 0.45:1.1 | - | 0.7:1.1 | 0.8 | 1.2 |
| Area (mm$^2$) | 1.3 | 1 | 189.8 | 1.5 | 25 | 0.97 |
| Input & Weight Precisions | 2b-8b & 2b-8b | b-4b & 1b | 2b-8b & 2b-8b | 8b & 8b | 1b-8b & 1b-8b | 8.06 & 8.06 |
| 8b Throughput (TOPS) | 0.117 | 0.127 | 21.3 | 1 | 3 | 0.18 |
| 8b Energy Efficiency (TOPS/W) | 101.9 | 15.5 | 5.2 | 32.2 | 30 | 150 |
| 8b Area Efficiency (TOPS/mm$^2$) | 4.2 | 2.6 | 0.116 | 4 | 0.679 | 0.186 |

FIG. 6A

600

Performance Compared to SoA Analog Correlators

| | A. R. Javed BCTM 16 | Q. Wu TMTT23 | V. Mangal JSSC20 | This Work |
|---|---|---|---|---|
| Tech. | 130nm NPN | 1um GaAS HBT | 65nm CMOS | 65nm |
| Correlation Mechanism | Analog Multiply and Integrate | Pumped T-line | Analog Time Domain | ReLU MP |
| Input Sampling Rate | 33 GS/s | 0.6-1.1GS/s | 100 S/s | 5 GS/s |
| Input 1, Input 2 | Analog↑1 bit | Analog↑LO | Analog↑1 bit | Analog, Analog (8b, 8b) |
| Code Length | 1 | 8 | 11 | 1024 |
| Power | 123 mW | 1288 mW | 40 nW* | 1.2 mW** |
| Correlator FoM (pJ/Corr/Len) | 3.7 | 293 | 400 | 0.24 |
| Area (mm2) | 0.15 (est) | 78.61 | 0.09 | 0.97 |
| Compute Area/Corr. Len (mm2) | 0.15 | 39.304 | 0.0082 | 0.00095 |

FIG. 6B

600

Performance Compared to SoA compressive sensing ICs

|  | G. Han JSSC21 | D. Adams JSSC 17 | R. Yazicigil JSSC15 | This Work |
|---|---|---|---|---|
| CMOS Tech. | 65nm | 65nm | 65nm | 65nm |
| Approach | Multi-branch mixer | Mixer with mod. LO | Quad. Mixer | ReLU MP Corr. |
| Input BW (MHz) | 385-1015 | < 900 | 2700 to 3700 | < 2500 |
| Number of Detected Signals | 2 | 4 | 3 | 4 |
| RBW(MHz) | 20 | 20 | 20 | 4.9 |
| Number of Freq Bins | 32 | 45 | 50 | 512 |
| Scan Time (us) | 0.71 | 1.2 | 4.4 | 26.2 |
| Energy per Scan (nJ) | 36.9 | 1076.0 | 528.0 | 713 (31.5 for MP Core) |
| FoM: Energy per Detected Signal (nJ)/ Number of Freq Bins | 0.58 | 6.0 | 3.5 | 0.35 (0.015 for MP Core) |

$$\sum_{n=1}^{N} I_n(A - V_{out}^+ - (V_{Th} - \Delta(B))) + I_n( -A - V_{out}^+ - (V_{Th} + \Delta(B))) = I_{sink}$$

$$\sum_{n=1}^{N} I_n(A - V_{out}^+ - (V_{Th} + \Delta(B))) + I_n( -A - V_{out}^+ - (V_{Th} - \Delta(B))) = I_{sink}$$

$V_{out}^+ - V_{out}^-$ ) approximates the correlation between A and B

1500

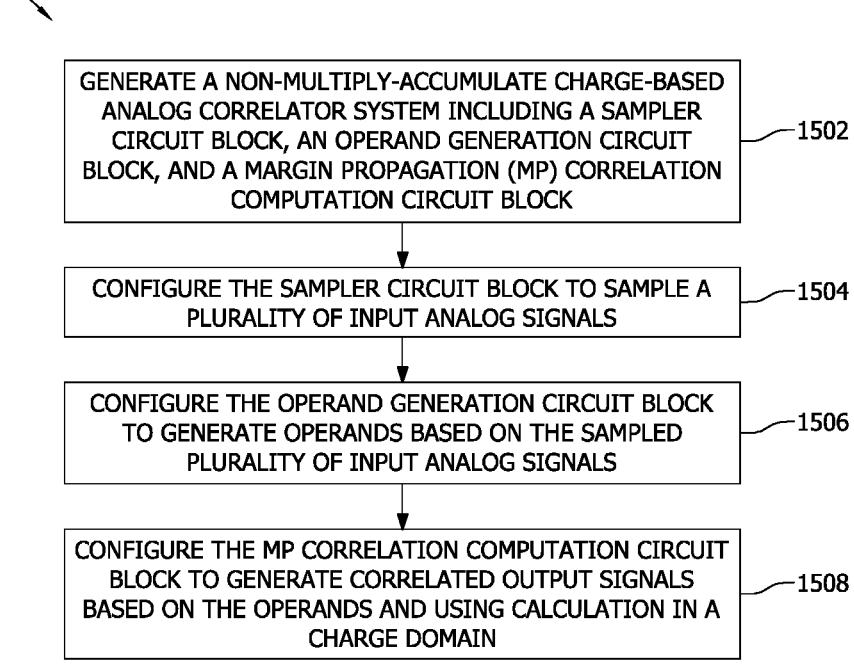

GENERATE A NON-MULTIPLY-ACCUMULATE CHARGE-BASED ANALOG CORRELATOR SYSTEM INCLUDING A SAMPLER CIRCUIT BLOCK, AN OPERAND GENERATION CIRCUIT BLOCK, AND A MARGIN PROPAGATION (MP) CORRELATION COMPUTATION CIRCUIT BLOCK ⌐1502

CONFIGURE THE SAMPLER CIRCUIT BLOCK TO SAMPLE A PLURALITY OF INPUT ANALOG SIGNALS ⌐1504

CONFIGURE THE OPERAND GENERATION CIRCUIT BLOCK TO GENERATE OPERANDS BASED ON THE SAMPLED PLURALITY OF INPUT ANALOG SIGNALS ⌐1506

CONFIGURE THE MP CORRELATION COMPUTATION CIRCUIT BLOCK TO GENERATE CORRELATED OUTPUT SIGNALS BASED ON THE OPERANDS AND USING CALCULATION IN A CHARGE DOMAIN ⌐1508

| TA2 Metric | Baseline (BAA) | TA1 Phase-3 (BAA) | MoonShot (BAA) | Phase-I (Target) | Phase-II (Target) | | Phase-III (Target) |
|---|---|---|---|---|---|---|---|
| Concept | - | - | - | Diode-Capacitor | Diode-Capacitor | Tailored-Device | Tailored-Device |
| TOP/s/W | <5 | 100 | 1000 | 1000 | 500 | 1000 | 1000 |
| Dynamic Range (dB) | 48 | 72 | 92 | 78 | 92 | 78 | 92 |
| Correlator Length | 16 | 65,536 | >523,288 | 1024 | 8192 | 8192 | >65,536 |
| Total Area (mm$^2$) | - | - | - | <0.5 | <2 | <0.5 | <2 |
| Target Technology | - | - | - | Intel 22mm FL | Intel 22mm FL | Intel 12mm LP | Intel 12mm LP |

FIG. 18

1900A $$V_{out} = V_{out}^{+} - V_{out}^{-} = MP(V_{i}^{+}, Q(t)/C) - MP(V_{i}^{-}, Q(t)/C)$$

2400a

2400b

2400c

2500

2600

A[i]

Switching

B[i]

Not Shown

Operands for charge-based MP-ASP
to calculate A$^T$.B

+A[i]+B[i]    -A[i]-B[i]    +A[i]-B[i]    -A[i]+B[i]

Walsh-Function
Sequence

2700a

WF$_1$

WF$_2$

WF$_N$

SCALING-FRIENDLY, ANALOG CORRELATORS USING CHARGE-BASED MARGIN PROPAGATION

CROSS-REFERENCE TO RELATED APPLICATION

This application claims priority to and the benefit of U.S. Provisional Patent Application Ser. No. 63/379,168, entitled "SCALING-FRIENDLY, ANALOG CORRELATORS USING CHARGE-BASED MARGIN PROPAGATION," filed Oct. 12, 2022, and the contents of which are incorporated herein in their entirety.

STATEMENT REGARDING FEDERALLY SPONSORED RESEARCH AND DEVELOPMENT

This invention is made with government support under HR0011-22-S-0021 awarded by the Defense Advanced Research Projects Agency (DOD/DARPA). The government has certain rights in the invention.

BACKGROUND

The field of the disclosure relates generally to processing of radar signals, and in particular, processing of the radar signals using non-multiply-accumulate charge-based analog correlators.

Correlation operations are fundamental to radar signal processing, communication signal processing, and analog-to-information (A-to-I) applications, for example, for spectrum sensing and so on. Correlation operations constitute a significant part of cost and power consumption. Conventional approaches for designing energy-efficient analog correlators follow a digital multiply-and-accumulate (MAC) based architecture with power consumption scaling with frequency, computing, and analog-to-digital conversion (ADC) power, which use in-memory analog computing involving variable conductance (phase-change/resistances). However, their resolution is limited by the performance/calibration of variable conductance (limited by noise and array size trade-offs).

In some analog correlators, analog-to-digital conversions are eliminated. However, such analog correlators need high power/area and/or suffer from small correlation lengths (e.g., about 10 samples). While matrix multiplication in compute-in-memory (CiM) cores are used for correlation, such blocks generally operate at a very low speed for multi-bit inputs.

Accordingly, there is a need to develop an analog correlator, which is capable of correlating inputs with multiple target sequences, while focusing on power and area efficiency for correlation operations.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a non-multiply-accumulate (non-MAC) charge-based analog correlator system including a sampler circuit block, an operand generation circuit block, and a margin propagation (MP) correlation computation circuit block is disclosed. The sampler circuit block is configured to sample a plurality of input analog signals. The operand generation circuit block is configured to generate operands based on the sampled plurality of input analog signals, and the margin propagation (MP) correlation computation circuit block is configured to generate correlated output signals based on the operands and using calculations in a charge domain.

In another aspect, a method for generating a non-multiply-accumulate (non-MAC) charge-based analog correlator system comprising a sampler circuit block, an operand generation circuit block, and a margin propagation (MP) correlation computation circuit block is disclosed. The method includes configuring the sampler circuit block to sample a plurality of input analog signals. The method includes configuring the operand generation circuit block to generate operands based on the sampled plurality of input analog signals and configuring the MP correlation computation circuit block to generate correlated output signals based on the operands and using calculations in a charge domain.

DRAWINGS

FIGS. 3A-3B illustrate a schematic block diagram of rectifying-linear-unit (ReLU) margin propagation-based correlator implemented in 65 nm complementary metal oxide semiconductor (CMOS) according to embodiments described in the present disclosure.

FIGS. 4A-4B illustrate measured performance for periodic and random inputs for the non-MAC charge-based analog correlator.

FIGS. 6A-6C illustrate comparison of the state-of-the-art digital MAC correlator with the non-MAC charge-based analog correlator according to embodiments as described in the present disclosure.

FIG. 15 illustrates a flow-chart of method operations of generating a non-multiply-accumulate (non-MAC) charge-based analog correlator system according to embodiments as described in the present disclosure.

FIG. 18 illustrates performance metric targets for charge-based MP correlators for 5 GHz sampling rate according to embodiments as described in the present disclosure.

DETAILED DESCRIPTION

In various embodiments, in the present disclosure, a non-MAC charge-based analog correlator is described. The correlation between two signals can be viewed as a pattern-matching computation where ensemble redundancy provides robustness to approximation errors. For example, an L1 distance-based digital-domain approximation for the dot-product may be used in achieving about 100 TeraOps per second per W (TOPS/W), and targeting applications where inputs are available as multi-bit words. In some embodiments, analog-domain approximation in correlators described in the present disclosure (i) support long sequences (e.g., greater than 1000), (ii) exhibit improved accuracy with higher sequence length (similar to MAC), and (iii) achieve high compute energy efficiency comparable to digital MAC while eliminating input ADCs.

A novel direct-RF, wideband correlator described in the present disclosure is based on the margin-propagation (MP) paradigm in standard 65 nm CMOS that achieves: (i) correlation of instantaneously wideband RF inputs (DC -2.5 GHz, e.g., 2× better than currently known wideband correlator), (ii) large correlation length of 1024 in analog domain that is more than 100× better than currently known wideband correlator, (iii) 8-bit computing accuracy that is also known as hardware-dynamic range of 50.3 dB, and/or (iv) high compute efficiency of 152 TOPS/W that is conventionally provided only by digital-intensive compute schemes. By way of a non-limiting example, correlators as described in the present disclosure according to various embodiments may be applicable for system-level measurements/applications such as radar signal processing, code-domain processing, and spectrum sensing using compressive sampling.

Figure 1A:
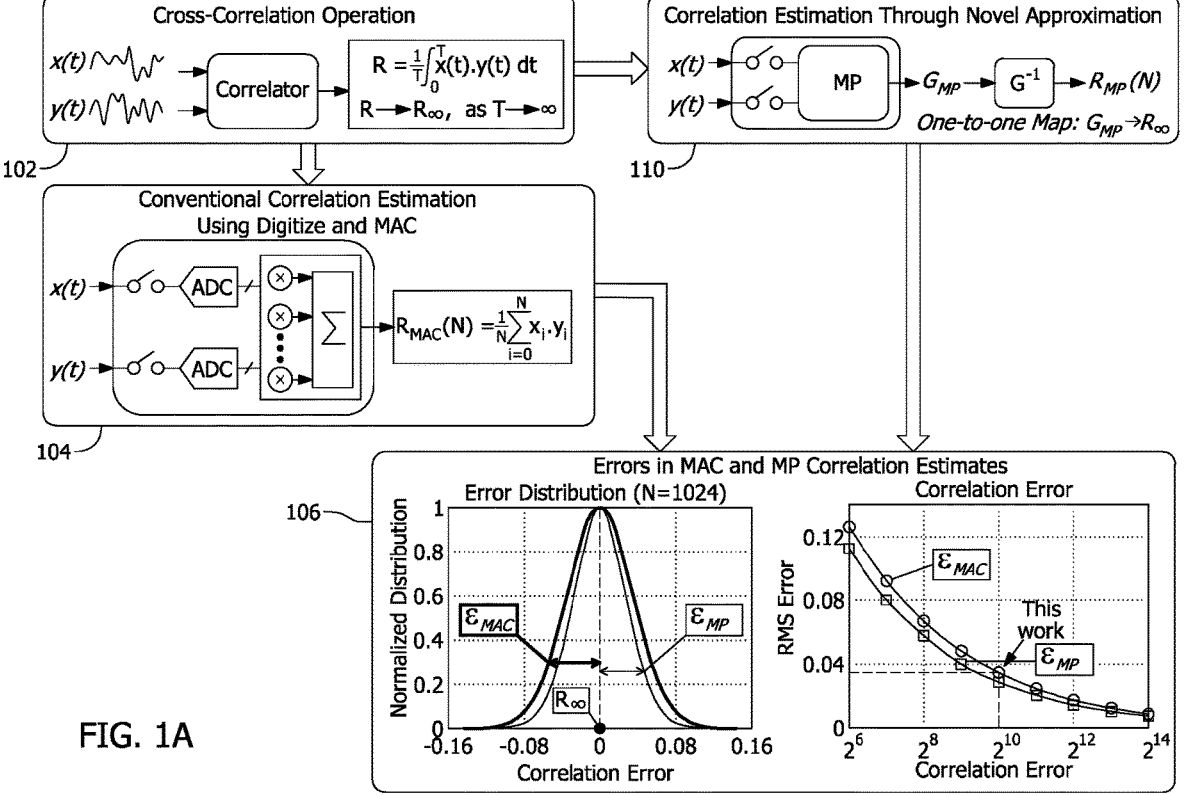
FIGS. 1A-1B illustrate high-level block diagrams of digital multiply-and-accumulate (MAC) and non-MAC charge-based analog correlators according to some embodiments of the present disclosure.
Figure 1B:
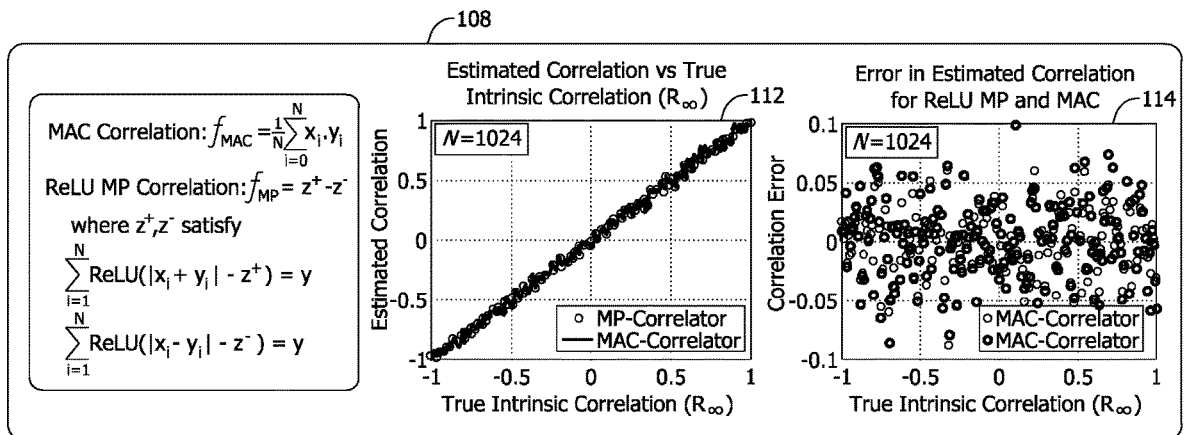

As described in the present disclosure, and shown in FIGS. 1A-1B, correlation between input signals can be estimated using approximation functions. By way of a non-limiting example, in some embodiments, the approximation functions may include analog-friendly threshold-based margin-propagation (MP) function that provides correlation estimation with precision that is comparable to conventional digital MAC correlators. Precision of the MP-correlators improves for longer sequence lengths. Accordingly, the true cross-correlation ($R_\infty$) between two random input sequences, X and Y, may be measurable over long sequence lengths using a correlator as shown in FIG. 1A shown as 102. For two random sequences, even MAC cross-correlators shown in FIG. 1A as 104 converge to $R_\infty$ as sequence length is increased, with estimation errors for finite lengths depending upon sequence periodicity and probability distributions. However, As shown in FIGS. 1A-1B, correlation can also be estimated using MP-functions that operate on additive and subtractive operands such as X±Y.

For random sequences, the correlation is predicted by MP-approximation ($R_{MP}$) that follows a similar error distribution to MAC schemes ($R_{MAC}$) (e.g., $\varepsilon_{MP}^2 = |R_{MP} - R_\infty|^2 \sim \varepsilon_{MAC}^2 = |R_{MAC} - R_\infty|^2$), with both $R_{MAC}$ and $R_{MP}$ converging to $R_\infty$ as sequence length, $N \rightarrow \infty$ as shown in FIG. 1A as 106. While various possibilities exist for MP functions, as shown in FIG. 1 as 108, thresholding-based rectifying-linear-unit (ReLU) function is well-suited for low-power implementations, where $R_{MP} = G^{-1}(z^+ - z^-)$, with $z^\pm$ satisfying $\Sigma_{i=1}^{N} \text{ReLU}(|x_i \pm y_i| - z^\pm) = \gamma$, where $x_i$ and $y_i$ are elements of X and Y, where $\gamma$ is a hyper-parameter, and G is a monotonic one-to-one mapping function, approximated by a $5^{th}$-order polynomial as shown in FIG. 1A as 110.

As shown in FIG. 1A, using the correlator as shown in FIG. 1A as 102, ADCs are eliminated, MP correlators have comparable error distribution and correlation error with MAC based correlators. Elimination of ADCs simplify analog correlators and improve area and power efficiency. Other performance metrics, e.g., estimated correlation versus true intrinsic correlation, and/or correlation error versus true intrinsic correlation for MP correlators and MAC based correlators are comparable as shown in FIG. 1B as 112 and 114, respectively.

Figure 2A:
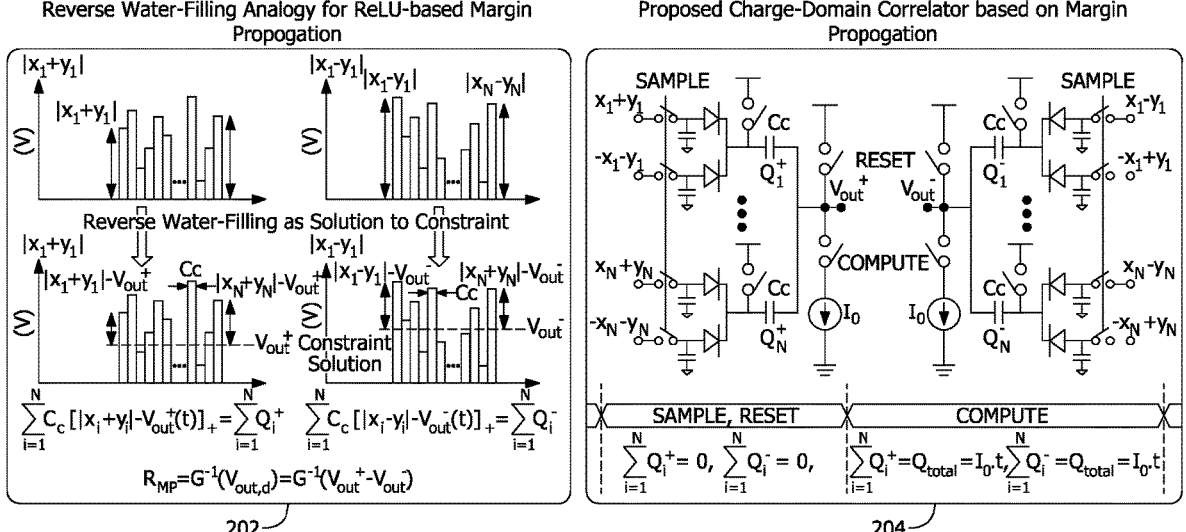
FIGS. 2A-2B illustrate a schematic block diagram of a diode and a capacitor based non-MAC charge-based analog correlator and its comparison with digital MAC analog correlator according to some embodiments of the present disclosure.

As described in the present disclosure, and shown in FIG. 2A as 202, rectifying-linear-unit (ReLU) MP approximation is analogous to a reverse water-filling problem of finding an output voltage for a given set of inputs when the total charge across all compute capacitors ($C_c$), $Q_{total}$, is constrained. Conventional current-domain MP-compute circuits require bias currents that lead to high power for long correlation lengths. As described herein, in some embodiments, charge-domain scheme to compute MP-based correlation as shown in FIG. 2A as 204 may be used. The thresholding-MP function can be realized using charge-coupled diode-capacitor circuits and the hyperparameter $\gamma = Q_{total}/C_c$ as shown in FIG. 2A as 204.

Four-quadrant operands ($\pm x_i \pm y_i$) are applied to the diodes, as shown in FIG. 2A as 204. At reset, the output voltages may be as $V_{out}^+ = V_{out}^- = V_{DD}$ and total charge may be as $Q_{total} = 0$. During the compute phase, the total charge $Q_{total} = I_0 t$, the diode outputs $V_i^\pm = \max(|x_i \pm y_i|, V_{out}^\pm)$, and the thresholding-MP condition $\Sigma_{i=1}^{N} C_c \times \text{ReLU}(|x_i \pm y_i| - V_{out}^\pm) = Q_{total}$ are satisfied. Thus, the differential voltage $V_{out,d} = (V_{out}^+ - V_{out}^-)$ estimates or corresponds with correlation, $R_{MP}$. A non-zero diode knee-voltage translates to a constant DC shift that does not impact $V_{out,d}$. The differential implementation is also insensitive to parasitic ground capacitances on the output node enabling scalability to large correlation lengths.

Figure 2B:
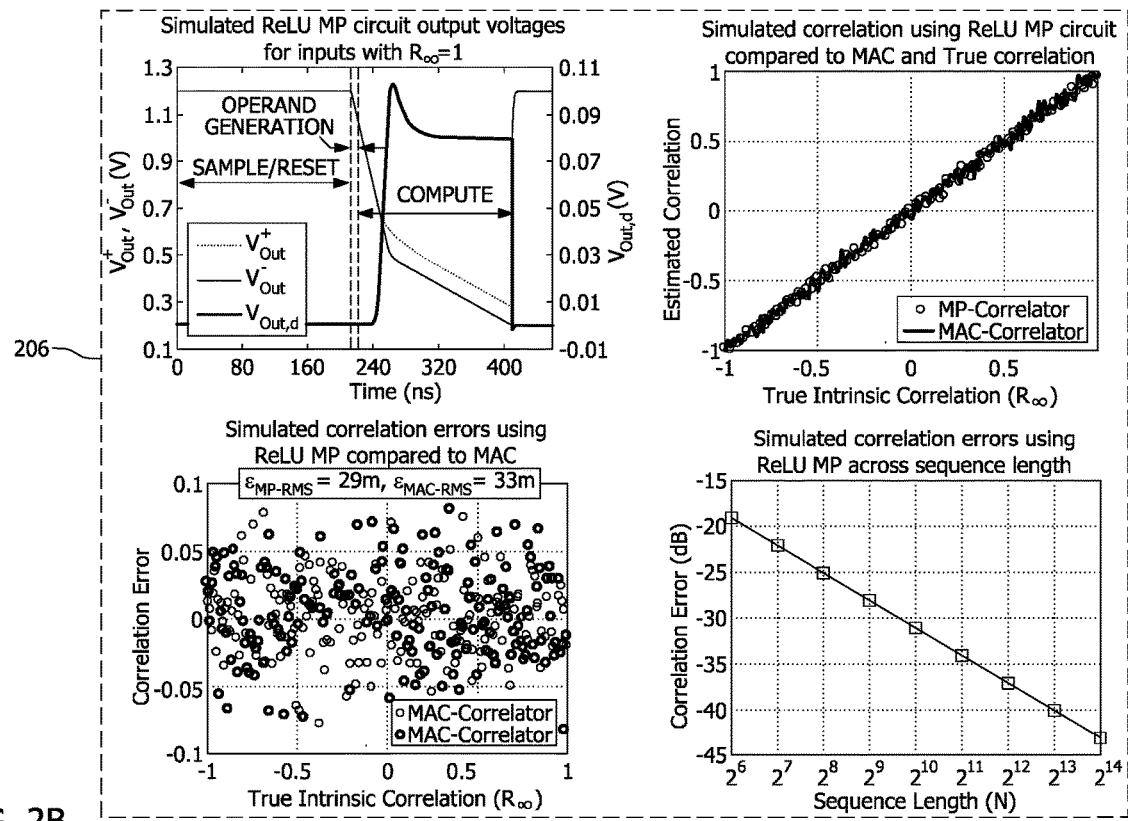

As shown in FIG. 2B as 206, the predicted correlation $R_{MP}$, correlation-error $\varepsilon_{MP}$ follow similar behavior as a MAC-correlator and the $\varepsilon_{MP} \rightarrow 0$ as N increases. In this MP-compute scheme, energy of $E_{core} = 2Q_{total}V_{DD}$ is drawn per N-length correlation with a precision of ENOB~8 and $E_{sampler}$ is consumed for driving the MP-core, resulting in a high compute-efficiency of $N(\text{ENOB}^2 + \text{ENOB})/(E_{core} + E_{sampler}) \sim 150$ TOPS/W.

Figure 3A:
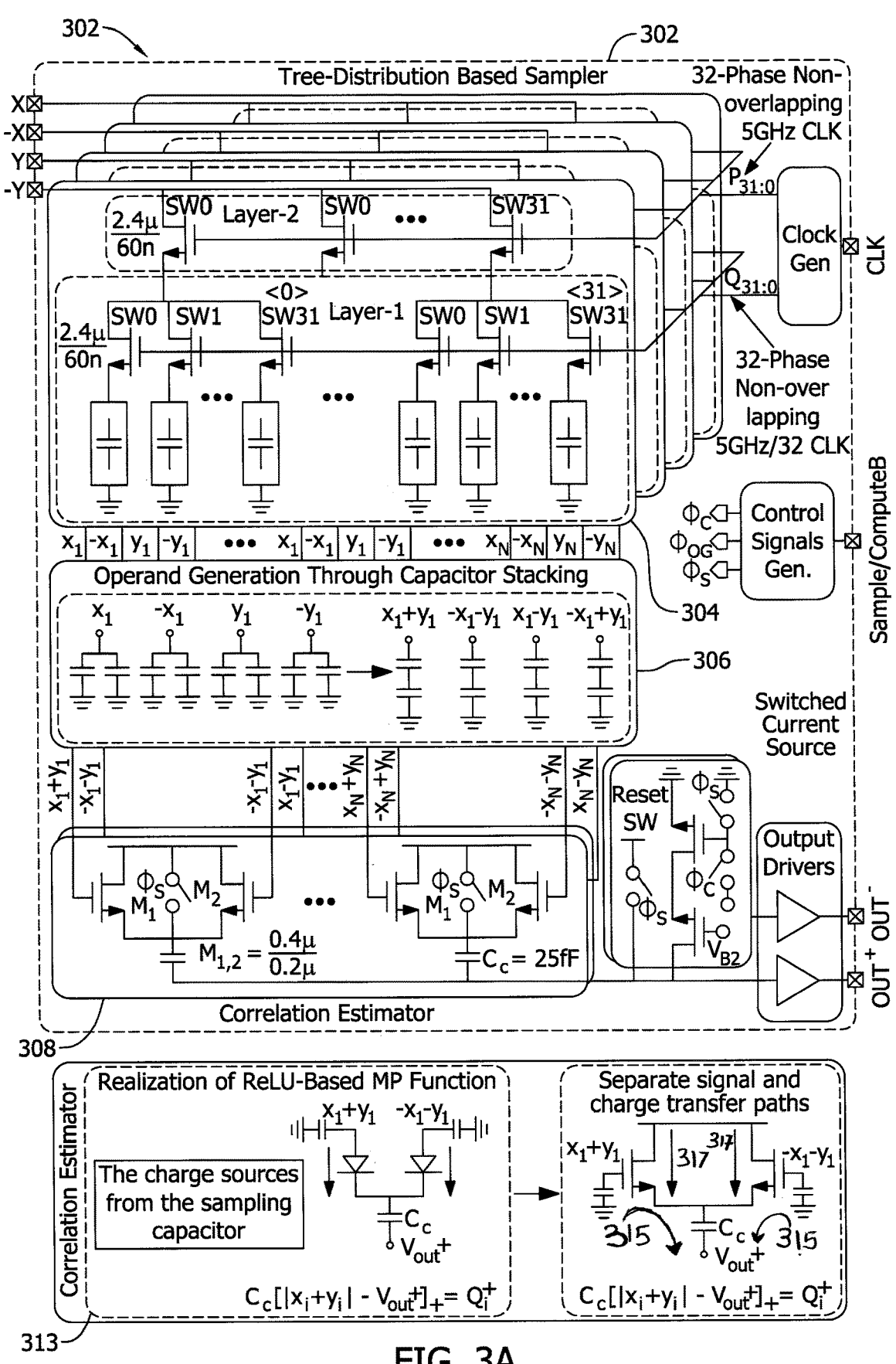

FIG. 3A shows a schematic of an example ReLU MP-based analog correlator 302 implemented in 65 nm complementary metal oxide semiconductor (CMOS). Operations of the MP-based analog correlator 302 may be divided into sampling phase, operand generation phase, and correlation compute phase being performed by circuit blocks 304, 306, and 308, respectively. The analog correlator 302 may be implemented as a low-power 5 GS/s, 1024-sample analog correlator using the thresholding-MP core shown in FIGS. 2A-2B.

As described herein, the MP-based analog correlator (which also may be referenced as a radiofrequency (RF) correlator) is divided into three sub-blocks—a sampler 304 that sequentially stores input samples on 1024 capacitors, an operand generator 306, and an MP correlation compute engine 308. The sampler 304 supports up to 5 GS/s with two-layer sampling to reduce the parasitic capacitance at the RF input node. For example, for each phase of an input signal, e.g., X, –X, Y, –Y, sampling is performed using a first-layer sampler 314 and a second-layer sampler 316. Following sampling, in the operand generator 306, the sampling capacitors, $C_{Si}$ are stacked to generate the four quadrant operands required by the MP-correlation estimator. The sampling capacitors, $C_{Si}$ (50 fF) are conservatively sized to ensure charge leakage during sampling and operand generation does not impact overall compute error. Finally, the operands are applied to the MP-core in the compute phase 308 to calculate the cross-correlation. In the MP compute cell, as shown in FIGS. 2A-2B, the compute charge $Q_{total}$ flowing through the diodes is sourced from the sampling capacitors, thus changing the operand value, and resulting in computing errors.

In some embodiments, in the CMOS implementation, the diode-capacitor configuration may be replaced with common-drain transistor ($M_{1,2}$) and capacitor to separate the signal and $Q_{total}$ transfer paths as shown in FIG. 3 as 313. The computation speed is determined by the charging rate of the compute cap, $C_C$ (25 femtofarad (fF)) which is selected conservatively at 10× the lower limit for 8-bit effective number of bits (ENOB) based on process mismatches and noise simulations. A 50 μA cascode current source can be used to impose the MP constraint, balancing speed, and power trade-offs. The analog output of the MP-core is driven off-chip using a high input-impedance amplifier with 1 GHz bandwidth. At 5 GS/s, input sampling requires ~200 nS, the operand generation settles in <2 ns, and a compute time of ~100 ns is used to sample the output.

The MP-based correlator may be an integrated circuit (IC) implemented in 65 nm CMOS with core power consumption of 1.2 mW at 1.2V (300 μW in sampler switch drivers, 680 μW in operand generator and 220 μW in MP-compute cell) at 5 GS/s. The multi-phase local oscillator (LO) generation consumes 4.2 mW and LO input buffers consume 22.2 mW. Each unit compute cell includes the sampling and operand generation circuits with overall 1024 correlator area of 0.97 mm².

Figure 4A:
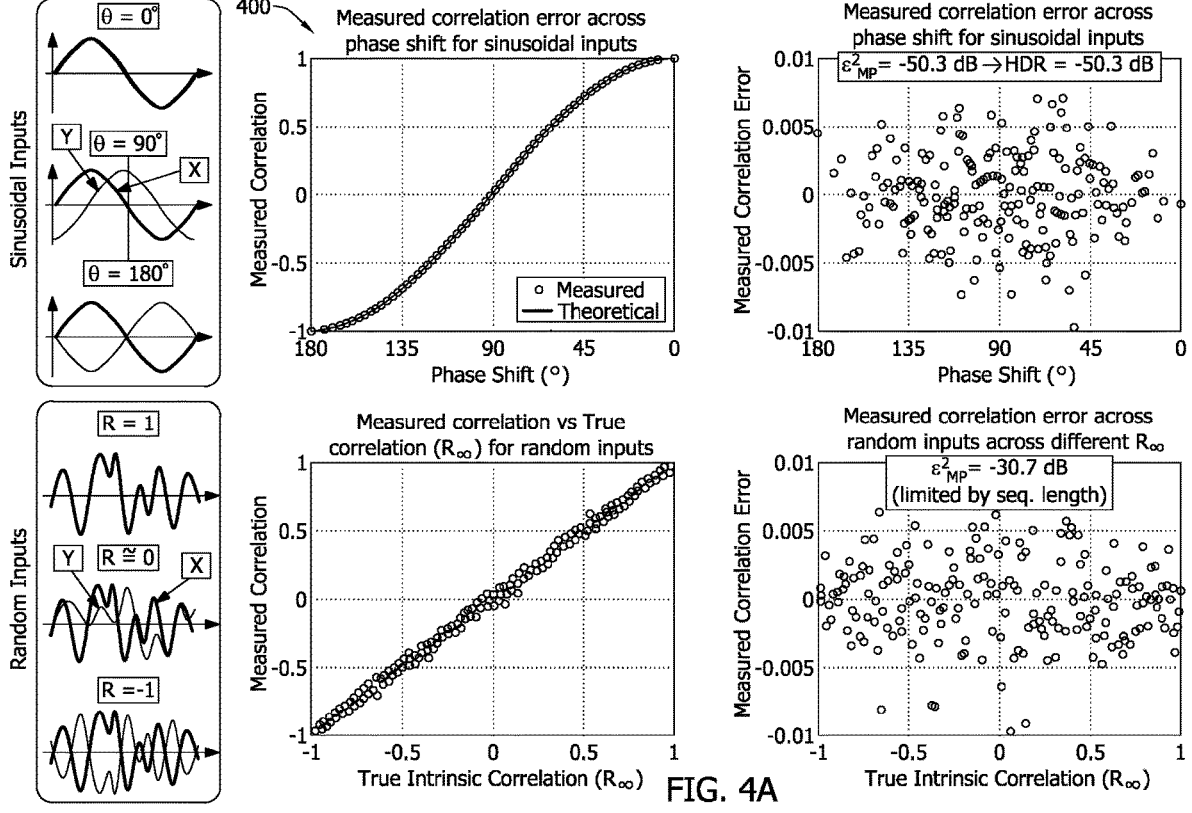

FIG. 4A and FIG. 4B show measured MP correlator performance 400. Measured performance shown in FIGS. 4A-4B may be measured for periodic and random inputs. With periodic sinusoid inputs, MP correlation ($R_{MP}$) is limited by MP approximation and hardware while demonstrating 8-bit performance. Measurements across random sequences show measured performance matching theory/simulations as described herein in accordance with some embodiments. Correlation across longer sequences show about 3 dB reduction in error for two times sequence lengths. Charge-domain MP computation is robust to supply voltage variations.

In some embodiments, errors in correlation computations may arise from (i) errors due to finite input length of sequences $\varepsilon_{len}$~$1/\sqrt{N}$ with $\varepsilon_{len}$→0 for larger sequence lengths, (ii) errors arising from the hardware MP implementation, $\varepsilon_{HW}$, that includes the MP-approximation and noise/mismatch (hardware-dynamic-range, HDR=20 log($1/\varepsilon_{HW}$)). In some embodiments, the errors from finite sequence lengths can be minimized with periodic inputs (i.e., $\varepsilon_{len}$=0 and $R_{N,finite}$=$R_\infty$) Thus, an HDR=50.3 dB (e.g., ENOB=8.06 bits) is measured when correlating two phase-shifted sinusoidal inputs. Measurements using random 5 GS/s input sequences with known correlations, show the measured correlation tracking $R_\infty$. In this case, the errors are −30.7 dB and are dominated by $\varepsilon_{len}$, with measured performance that follows simulations as shown in FIG. 2A-2B.

Correlator scalability measurements as shown in FIGS. 4A-4B where longer inputs are portioned into 1024-sample subsequences with correlation for longer sequence lengths (up to 8×1024=8192) may be computed by summing the outputs for each subsequence. The measured higher accuracy with increasing sequence length demonstrates the feasibility of the proposed approach for longer correlations. Measurements across ±20% supply voltage demonstrate robustness to voltage variations.

Figure 5A:
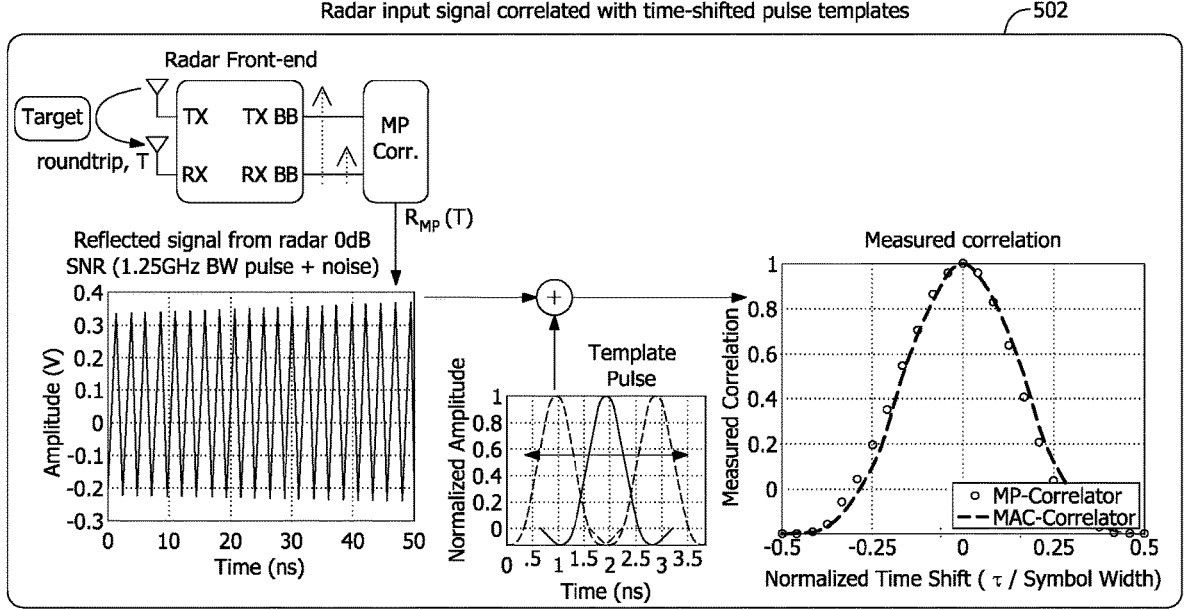
FIGS. 5A-5C illustrate a number of signal processing applications where the non-MAC charge-based analog correlator according to embodiments as described in the present disclosure can be used.
Figure 5B:
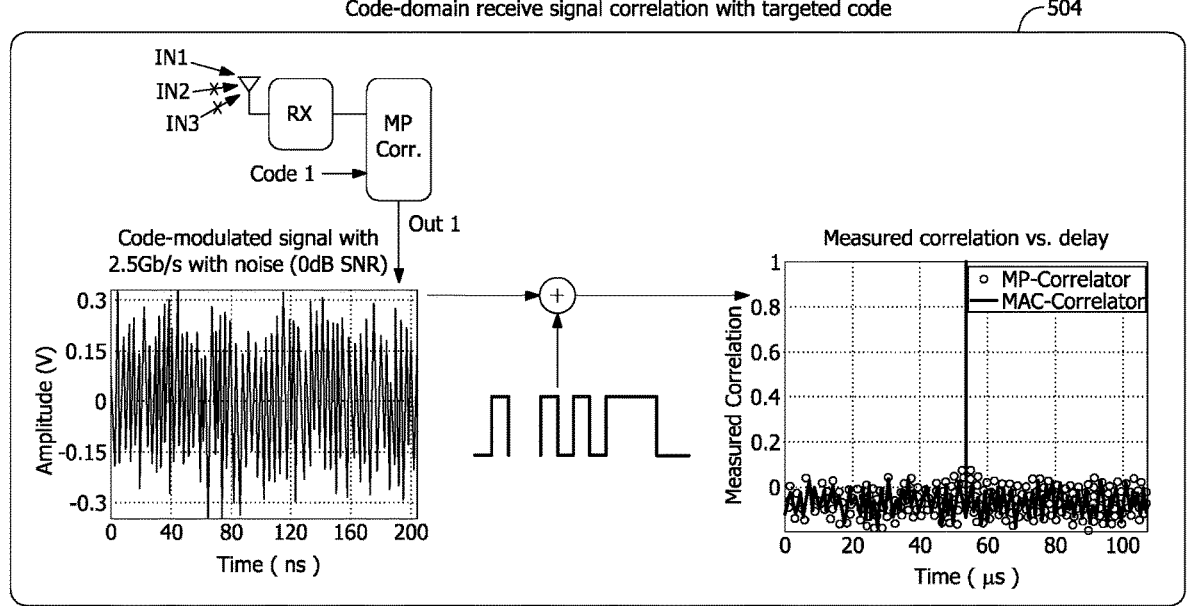
Figure 5C:
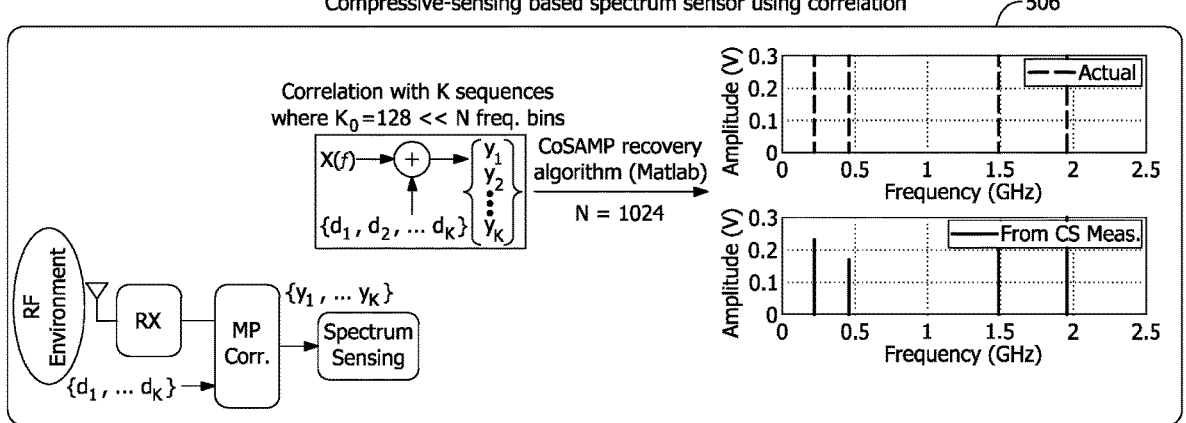

FIGS. 5A-5C illustrate system-level measurements for typical high-speed correlation functions. As shown in FIG. 5A, the correlation for a noisy 1.25 GHz BW radar pulse (SNR=0 dB) sampled at 5 GS/s demonstrates analog-domain performance comparable to a MAC correlator across time-shifted pulse templates. Similarly, an input PN code at 2.5 GHz chip rate with SNR=0 dB is correlated with delayed versions of the PN code and shows the expected impulse response for zero lag. The correlator is also used to perform compressive sensing measurements where a spectrally sparse input 1024 sequence with four 5 MHz frequency bins occupied is correlated with K (=128) sequences that represent a 128×1024 sensing matrix. The outputs are fed to a CoSAMP recovery in MATLAB, with an estimated spectrum close to the input spectrum. These measurements show how the MP correlator can be applied across signal processing applications such as radar signal processing 502 shown in FIG. 5A, code division signal processing 504 shown in FIG. 5B, and/or compressive sensing based spectrum sensing 506 shown in FIG. 5C, with correlation occurring in the analog domain, for example, at RF.

FIGS. 5A-5C demonstrate various signal processing applications that use MP-computation IC. One such signal processing application may include radar measurement for input 1.25 GHz BW pulse with noise (SNR=0 dB) correlated with pulse template. Measurements across delays show performance similar to MAC correlator. Measurement for 2.5 Gb/s pseudo-noise (PN) code-modulated 0 dB signal-to-noise-ratio (SNR) signal correlated with delayed PN code show expected impulse response. Compressive spectrum sensing application may use signal correlation with K basis sequences to detect sparse frequency spectrum (4 out of 512 bins occupied) with K<N measurements.

FIGS. 6A-6C illustrates the MP correlator performance 600 in comparison with the conventional analog correlators, including digital-intensive compute and analog/RF correlators. As shown in FIGS. 6A-6C, the MP correlator IC supports correlation for long sequences and is equivalent to a digital inner-product computation. The IC demonstrates high input frequency, higher correlator energy efficiency and longer correlation lengths while operating in the analog domain. The MP correlator IC supports correlation for long sequences and is equivalent to a digital inner-product computation. Performance of the IC in comparison with state-of-the-art digital/CiM vector multipliers as well as to analog correlators and spectrum sensors demonstrates higher energy efficiency than digital approaches while operating at RF frequencies in the analog domain.

Figure 7:
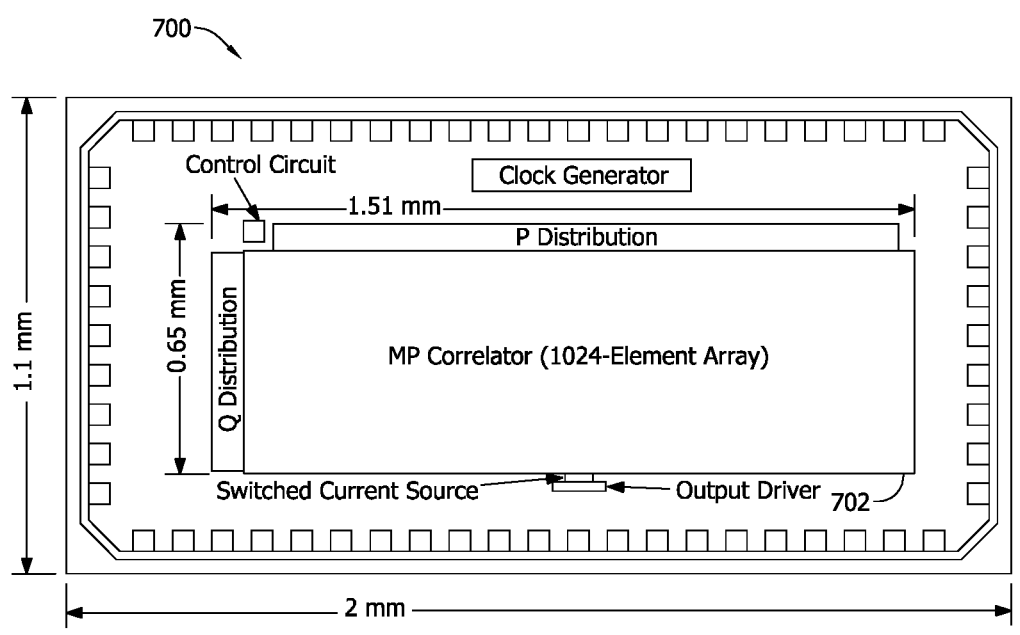
FIG. 7 illustrates an example die of an integrated circuit (IC) implementing the non-MAC charge-based analog correlator according to embodiments as described in the present disclosure.

FIG. 7 illustrates a die 700 of MP-based correlator IC 702 having 1024 samples for each input, operand generation and MP computation. By way of a non-limiting example, The MP-based correlator IC 702 may occupy 2 mm times 1.1 mm, for example, limited by MP and wattage requirements, in which MP-based correlator may occupy about 0.97 mm2.

Figure 8:
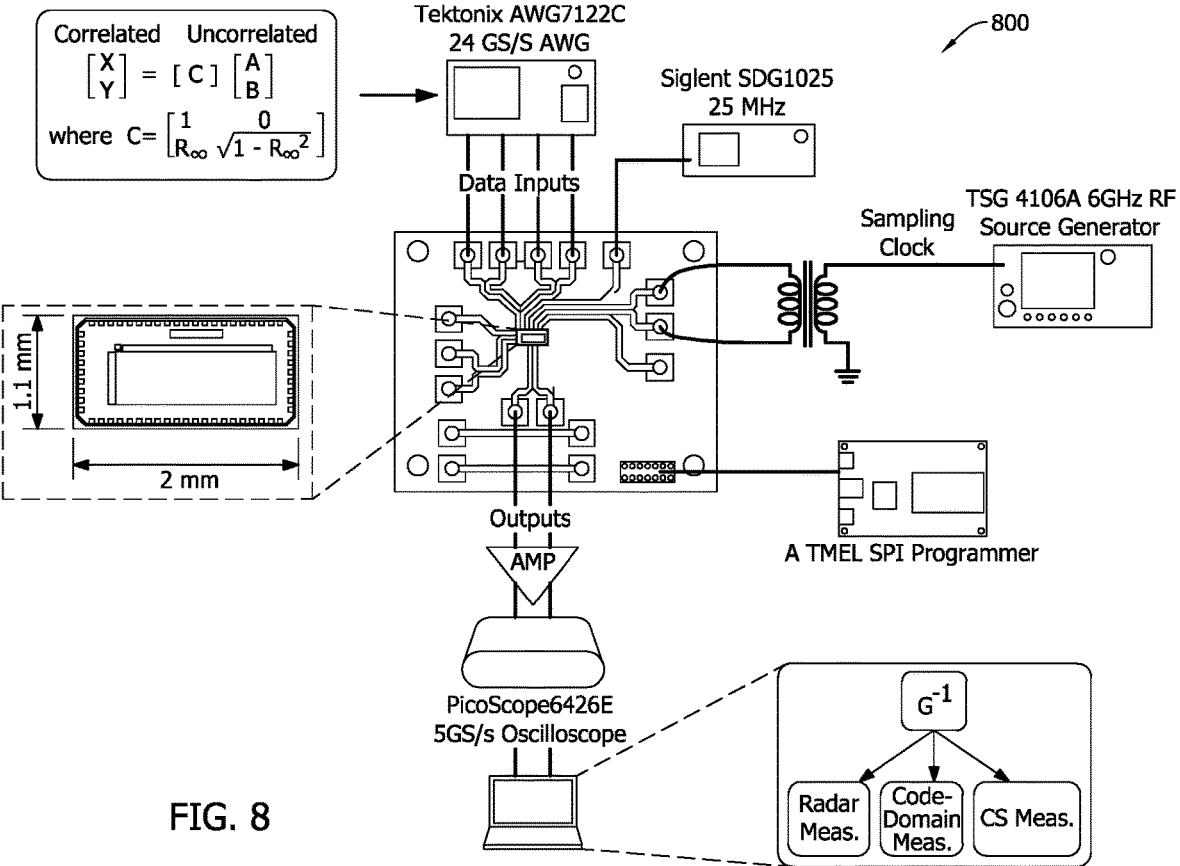
FIG. 8 illustrates an example IC wire bonded to a quad flat no-lead (QFN) package and mounted on a printed circuit board.

FIG. 8 illustrates an example connection or network diagram 800 in which an IC is wire bonded to a quad flat no-lead (QFN) package and mounted on a printed circuit board (PCB). Additionally, FIG. 8 illustrates measurement setup for correlation measurements with periodic and random input sequences A and B that correspond with correlated output sequences X and Y for measuring correlation C, with system-level processing of compressive sensing in MATLAB. Correlated sequences X and Y with desired targeted $R_\infty$ are generated from uncorrelated sequences A and B and applied to the IC through adding white Gaussian noise (AWGN).

Figure 9:
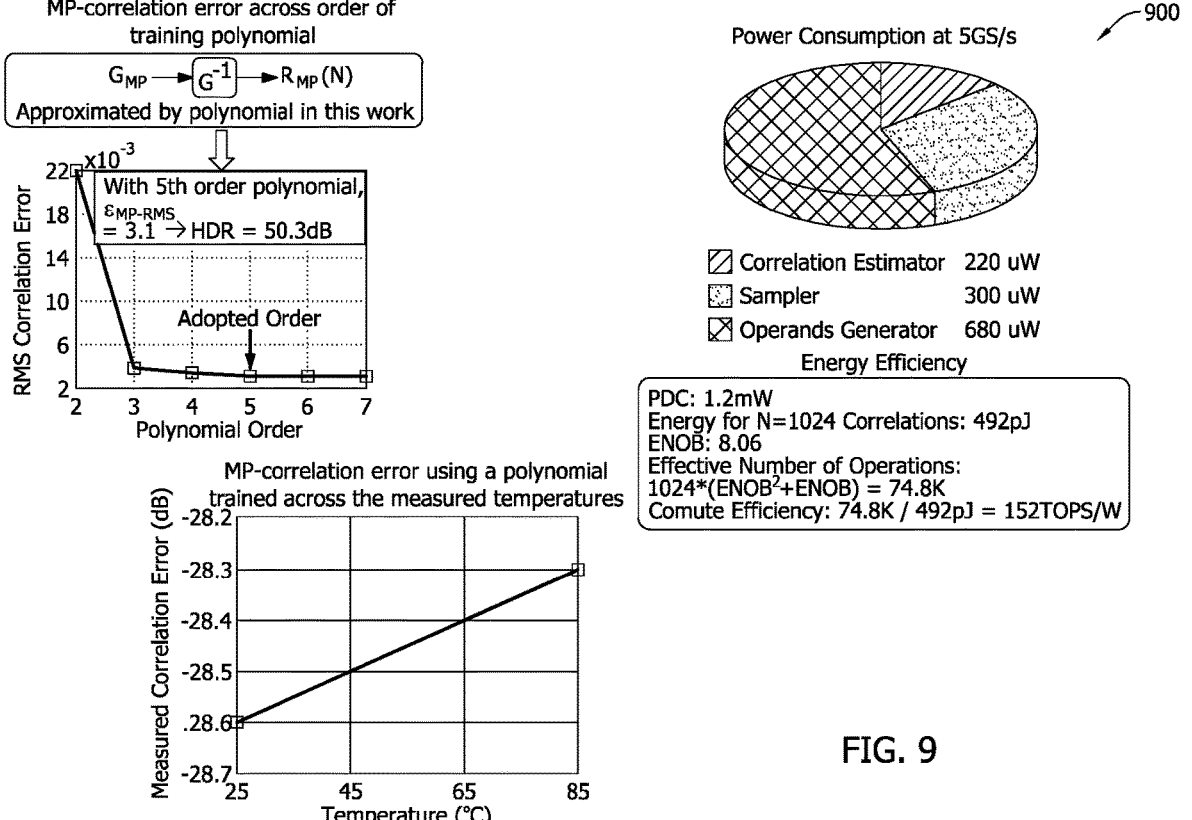
FIG. 9 illustrates power consumption by various circuit blocks of the non-MAC charge-based analog correlator according to embodiments as described in the present disclosure.

FIG. 9 illustrates a mapping from $G_{MP}$ to $R_{MP}$ that is implemented as a $5^{th}$-order polynomial with even lower order feasible (increase in error from $5^{th}$ order to $3^{rd}$ order is only 26% or ~2 dB) as shown in FIG. 9 as 900. Training dataset for polynomial coefficients is separate from validation data set. Initial measurements across temperature show limited degradation in error when polynomial is trained using data across temperature.

Figure 10A:
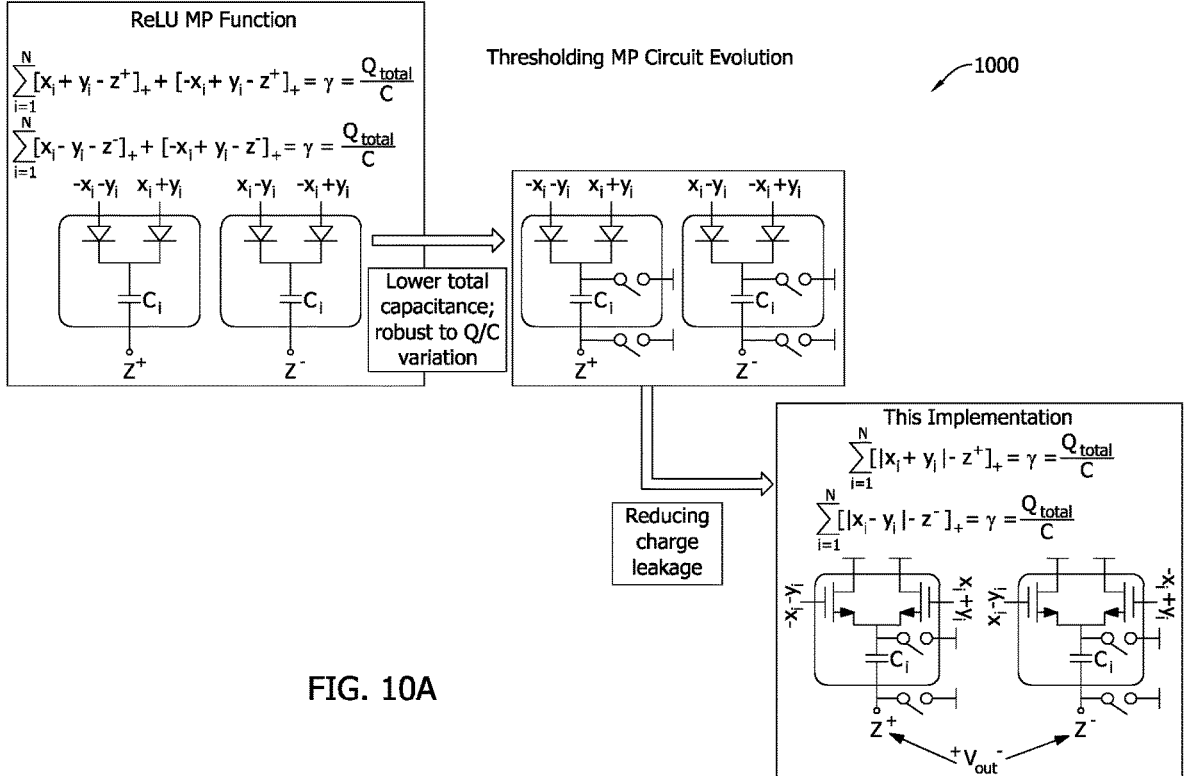
FIGS. 10A-10B illustrate an example thresholding MP circuit evolution according to embodiments as described in the present disclosure.
Figure 10B:
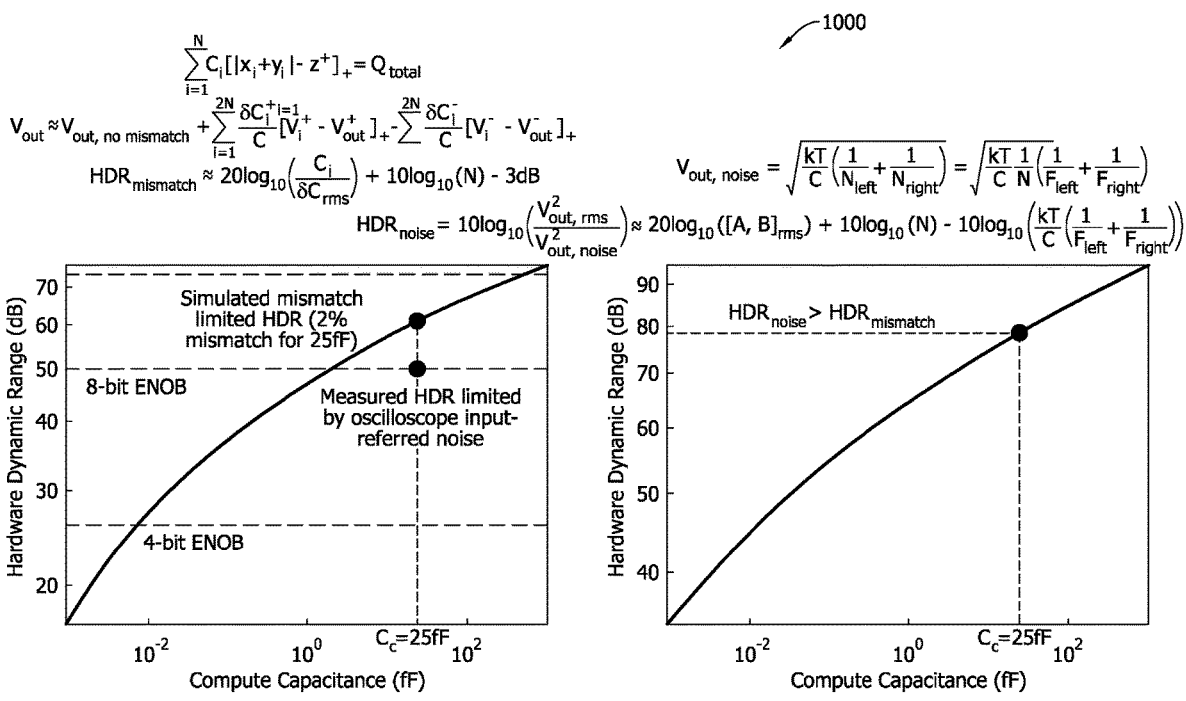

FIGS. 10A-10B illustrate area-efficient implementation of MP-thresholding function in hardware by combining compute capacitors and sourcing charge during compute phase from supply as 1000. Hardware dynamic range is limited by $C_c$ mismatch rather than noise for 25 fF $C_c$. Compute capacitor size selected conservatively (2% mismatch assumed in simulation); further improvements in measurement setup expected to improve measured high dynamic range (HDR).

Figure 11:
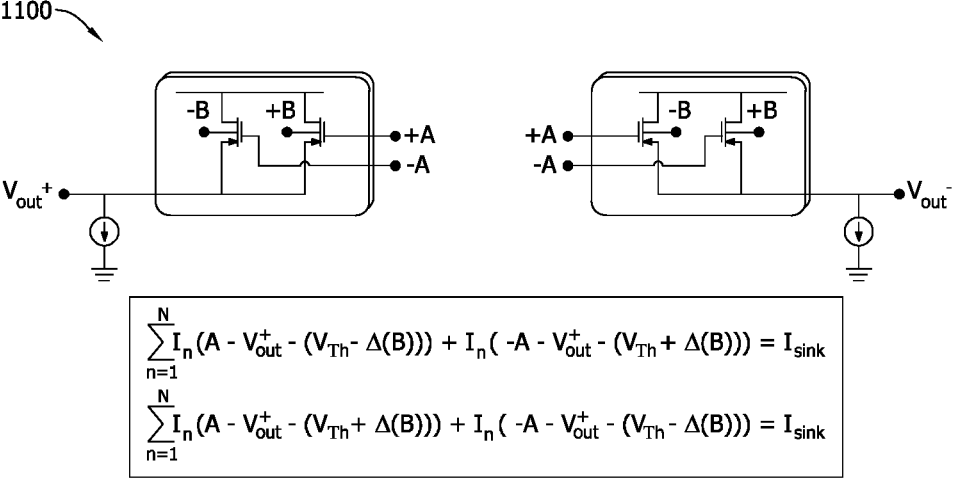
FIG. 11 illustrates an example analog correlation implementation using back gate according to embodiments as described in the present disclosure.

In some embodiments, analog correlators may be implemented using back gate as shown in a schematic diagram 1100 shown in FIG. 11. As shown in FIG. 11, well or body (e.g., back gate) bias may be used as a gate to control the V_threshold of a device. Back gate provides an extra degree of freedom to control the MOSFET, which can be used as an additional input. Additionally, or alternatively, the schematic diagram 1100 shown in FIG. 11 provides an alternative for the operand generation discussed herein using capacitor stacking and the diode-capacitor based charge thresholding circuit.

Figure 12:
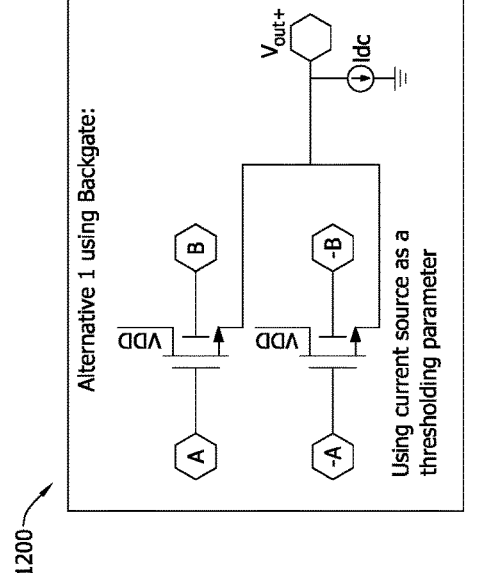
FIG. 12 illustrates a schematic diagram of a first alternative using back gate according to embodiments as described in the present disclosure.
Figure 13:
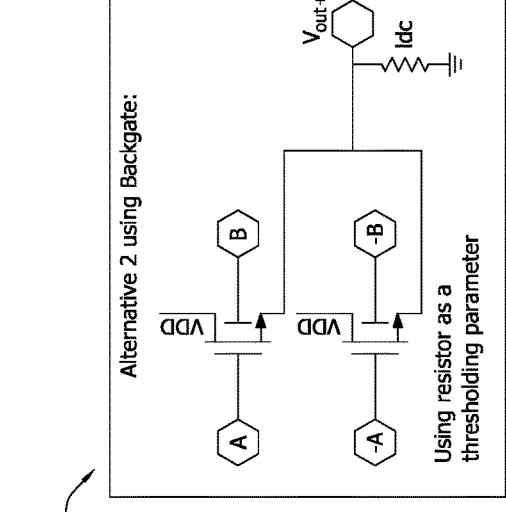
FIG. 13 illustrates a schematic diagram of a second alternative using back gate according to embodiments as described in the present disclosure.
Figure 14:
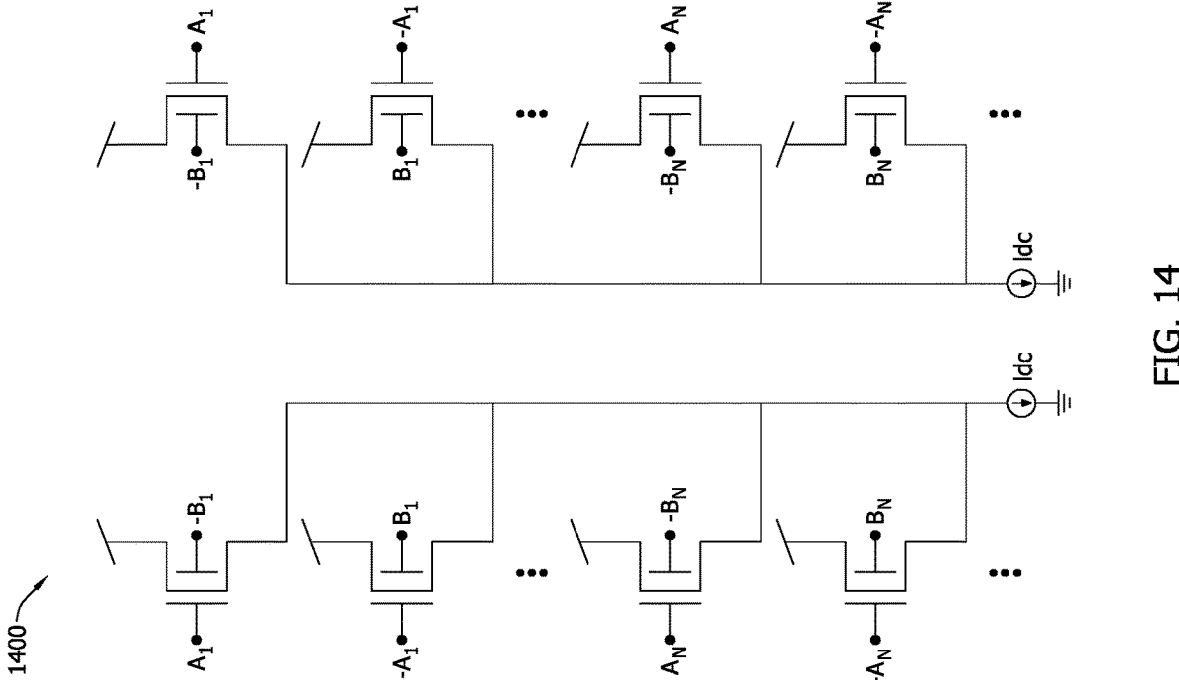
FIG. 14 illustrates a schematic diagram of an overall implementation of an N-length correlator according to embodiments as described in the present disclosure.

FIG. 12 illustrates a schematic diagram 1200 for using back gate in which a current source is used as a thresholding parameter. FIG. 13 illustrates a schematic diagram 1300 for using back gate in which a resistor is used as a thresholding parameter. Schematic diagrams 1200 and 1300 correspond with implementing for unit cells and are alternate implementations for unit cells. FIG. 14 illustrates a schematic diagram 1400 of an overall implementation of an N-length correlator, where a value N is a positive integer.

FIG. 15 illustrates a flow-chart 1500 of method operations of generating a non-multiply-accumulate (non-MAC) charge-based analog correlator system according to embodiments as described in the present disclosure. The non-MAC charge-based analog correlator system generates correlated output signals corresponding to a plurality of input analog signals. The method includes generating 1502 the non-MAC charge-based analog correlator system including a sampler circuit block, an operand generation circuit block, and a margin propagation (MP) correlation computation circuit block. The non-MAC charge-based analog correlator system may also include a clock signal generator, a control signals generator.

The method further includes configuring 1504 the sampler circuit block to sample the plurality of input analog signals using a clock signal 312 generated by a clock signal generator 310 shown in FIG. 3B. The sampler circuit block is configured to include a 2-layer circuit for processing each phase of an input analog signal of the input analog signals. The clock signal generator 310 is configured to generate the clock signal as a 32-phase non-overlapping 5 GHz clock signal as shown in FIG. 3B. The sampler circuit block is further configured to generate analog delay in the sampled plurality of input analog signals using cascaded delay elements. By way of a non-limiting example, the analog delay may be configured based on tree distribution.

The method further includes configuring 1506 the operand generation circuit block to receive control signals from the control signals generators, and generate operands based on the sampled plurality of input analog signals. The operand generation circuit block is configured to include a plurality of capacitors stacked together. The operand generation circuit block is configured to generate quadrant operands.

The method further includes configuring 1508 the MP correlation computation circuit block to generate correlated output signals corresponding to the plurality of input analog signals. The correlated output signals are generated based on the operands and using calculation in a charge domain. The MP correlation computation circuit block is configured to include a signal path and a charge transfer path and to implement rectifying-linear-unit (ReLU)-based MP function, and to correlate an input analog signal of the input analog signals of a sequence length of a value N. The value of N may be greater than or equal to 0, and less than or equal to 1023. As shown in FIG. 2A as 204 and in FIG. 3A as 313, the signal is sampled on to the capacitors and these sampling capacitors charge the coupling capacitor $C_c$ through the diodes. Due to the charge transfer from the sampling capacitor to the coupling capacitor, the sampled voltage may be altered and may result in inaccuracy in the computation. To avoid this, the diodes may be replaced with transistors such that the charge required by the coupling capacitor is drawn from the supply. Accordingly, the signal path 315 is separate from the charge transfer path 317. The MP correlation computation circuit block is configured to generate the correlated output signals based on the quadrant operands.

EXAMPLES

In some embodiments, the non-MAC charge-based analog correlator system is implemented as an integrated circuit (IC) using a 65 nm complementary metal oxide semiconductor (CMOS). The IC implemented using the 65 nm CMOS is designed or configured to have core power consumption of 1.2 mW at 1.2V at 5 GS/s. Additionally, or alternatively, the IC implemented using the 65 nm CMOS is designed or configured to have core power consumption including 300 µW in the sampler circuit block, 680 µW in the operand generation circuit block, and 220 µW in the margin propagation (MP) correlation computation circuit block at 5 GS/s.

In some embodiments, an architectural methodology described herein for designing a process technology scalable analog computing framework for machine learning (ML) at the edge. In other words, the non-MAC charge-based MP correlator described herein may be used in ML applications, such that analog computing system is scalable across different process nodes and independent of various operating regimes. By way of a non-limiting example, the MP correlator may be based on piecewise-linear (PWL) approximation algorithm, and the MP correlator may implement MP-kernel machine in 180 nm CMOS and 7 nm fin-shaped field-effect transistor (finFET) process nodes.

Implementation of a generic ML algorithm is dominated by MACs operation. To perform neural network calculations, neuron inputs are multiplied by the neuron weights, where the neuron inputs are vectors, and the neurons are a matrix. The outputs are the vectors created by multiplying the neuron inputs with the neuron weights. The MACs in ML computations completely dominate other functions like ReLU and MaxPool. Accordingly, to improve system performance of a ML algorithm, the MACs which are accumulated inner products need to be highly optimized in terms of energy efficiency and area.

As described herein, non-MAC charge-based MP analog correlator overcomes limitations associated with MAC correlators by mapping all operations into additions, subtractions, copy, and rectification. As described in the present disclosure, these operations can be implemented using transistor circuits whose functionality remains invariant with respect to its biasing conditions and process node implementation.

Figure 16:
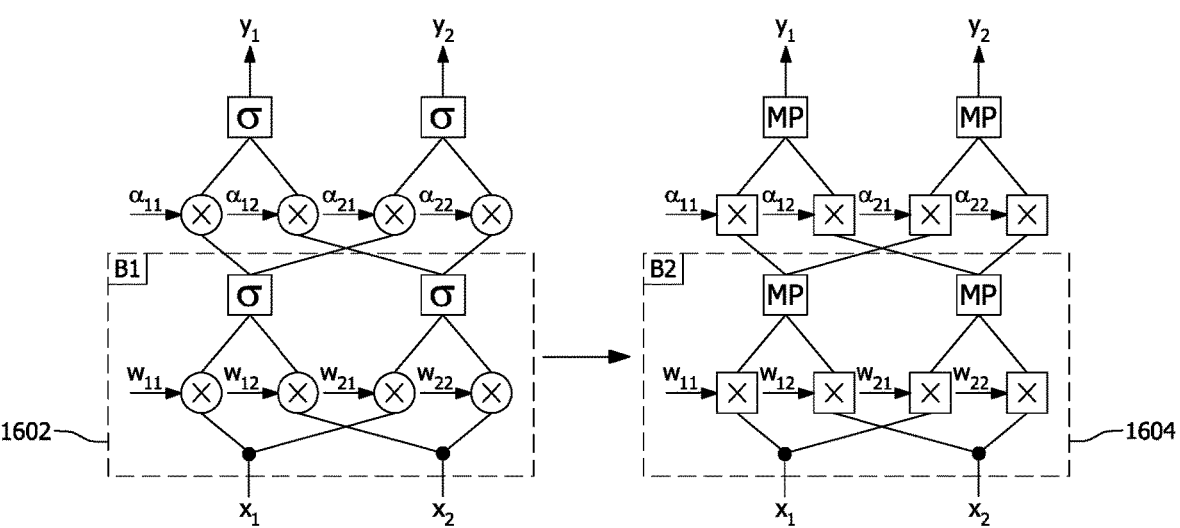
FIG. 16 illustrates a key distinction between a traditional neural network (NN) and an MP-based NN according to embodiments as described in the present disclosure.

Accordingly, the non-MAC charge-based MP analog correlator, as described herein, can be used for designing an MP-based neural network that exploits the inherent non-linearity in a differential MP computation and logarithmic approximation to simplify linear operations. FIG. 16 illustrates a key distinction between a traditional neural network (NN) 1602 and an MP-based NN 1604. The traditional NN 1602 and the MP-based NN 1604 each may be a two-layer NN. The traditional NN 1602 may use multiplication, addition, and a non-linear operation, which may be recursively applied to synthesize a large network. In the MP-based NN 1604, multiplications are mapped into additions and non-linear operations are replaced by an MP, which is a dot (•) operation. Similar to the traditional NN 1602, the MP-based NN 1604, which is an MP-based analog cell, can be recursively used to scale the size of the NN. In other words, the NN can be scaled using just MP (•) operations as the source of non-linearity and without any input pre-processing. The MP algorithm may thus be multiplier-less implementation of scalar inner product and its approximation using a single spline or multiple splines.

Figure 17A:
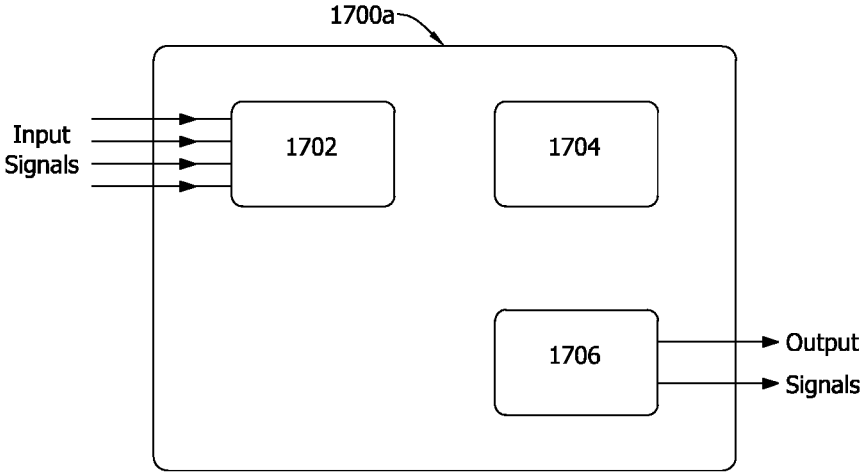
FIG. 17A illustrates a schematic block diagram of a charge-based analog correlator using MP according to embodiments as described in the present disclosure.

FIG. 17A illustrates a schematic block diagram 1700a of a charge-based analog correlator using MP according to embodiments as described in the present disclosure. As shown in the schematic block 1700a, the charge-based analog correlator may include a sampler circuit block 1702, an operand generation circuit block 1704, and an MP correlation computation circuit block. The sampler circuit block 1702 may receive a plurality of input signals and may be configured to sample the plurality of input analog signals. The operand generation circuit block 1704 may be configured to generate operands based on the sampled plurality of input analog signals, and the MP correlation computation circuit block 1706 may be configured generate correlated output signals based on the operands and using calculations in a charge domain. Since each of sampler circuit block 1702, the operand generation circuit block 1704, and the MP correlation computation circuit block 1706 are described in detail in the present disclosure, those details are not repeated here for brevity.

Figure 17B:
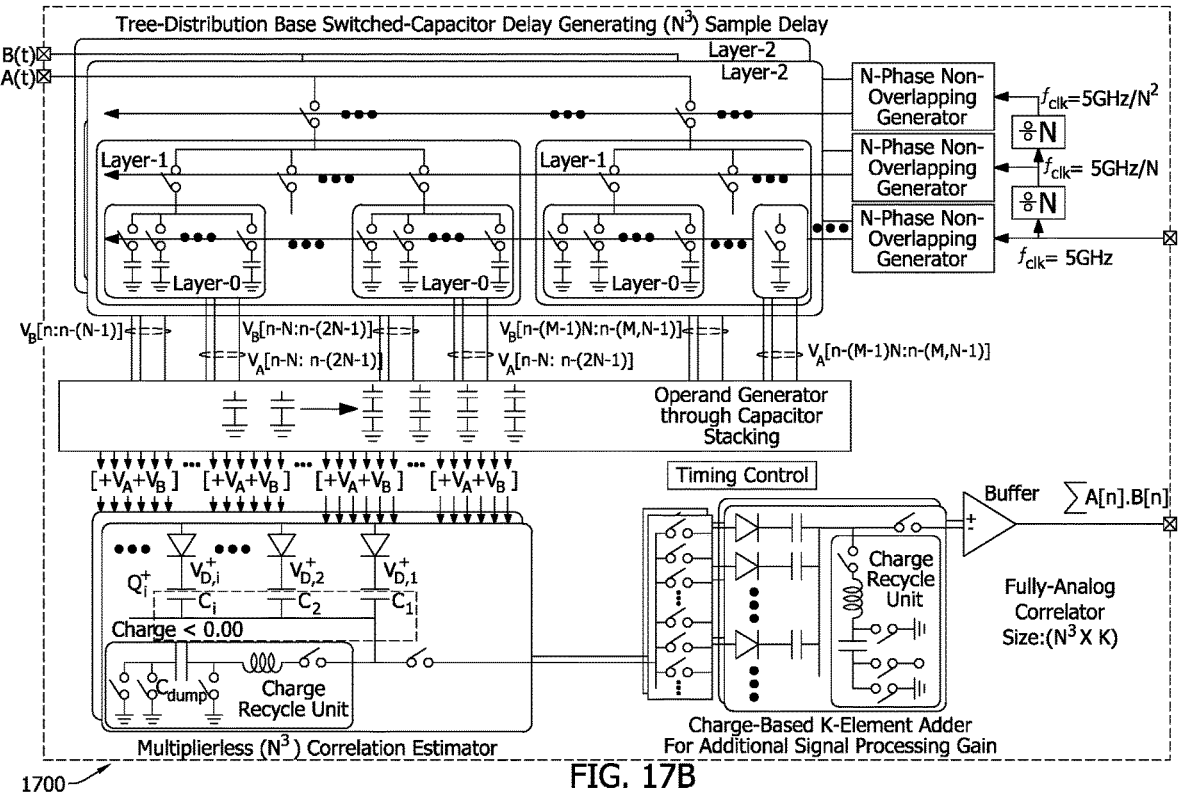
FIG. 17B illustrates a system architecture of a charge-based analog correlator using MP according to embodiments as described in the present disclosure.

FIG. 17B illustrates a system architecture 1700b of a charge-based analog correlator using MP according to embodiments as described in the present disclosure. In the following sections, additional information regarding non-MAC charge-based MP correlator is provided. The MP correlator follows a bottom-up, top-down framework for co-designing ultra-energy-efficient cross-correlators where higher-level signal processing approaches are precisely matched to computational primitives offered by underlying analog and/or mixed-signal hardware. By way of a non-limiting example, the device physics-based correlation using a charge-mode margin propagation technique exploits only rectification charge conservation and charge recycling primitives inherent in the physics of CMOS devices, which are designed to operate at the fundamental limits of energy-efficiency as determined by computational throughput, thermal-noise and the device dynamic range. Analog delay generation and delayed-sample distribution may be performed using time-interleaved switched-capacitor circuits that are wideband, extremely compact, low-loss, fully integrated in CMOS, and can support embedded voltage summation and subtraction, enabling analog generation of the delayed versions of the samples and the operands required by the MP-based analog signal processor (ASP). In the proposed architecture, mismatch and noise suppression through Walsh coding and dynamic element matching in the proposed architecture averages the device non-idealities by spreading and de-spreading the spectrum of the input operands, and, thereby, improving the overall hardware dynamic range.

FIG. 18 illustrates performance metric targets 1800 for charge-based MP correlators for 5 GHz sampling rate according to embodiments as described in the present disclosure. FIG. 18 summaries the performance that can be achieved in meeting power efficiency and hardware dynamic range requirements, while greatly exceeding base line metrics for the correlation length. Notably, the TOPs/(s×W)= 1000 (desirable power-efficiency) and hardware dynamic range of +78 dB, for a correlation length of 1024 may be achieved.

In some embodiments, analog cross-correlators as described in the present disclosure and according to FIG. 17 may follow a top-down design approach where the underlying analog hardware is designed to precisely mimic every multiply and accumulate (MAC) operations involved in cross-correlation. However, cross-correlation like any pattern matching computation has sufficient ensemble redundancy to tolerate minor approximation errors in individual MAC operations. Hence, mechanisms other than MAC can be used to estimate the true cross-correlation R, as long as cumulative approximation errors decrease monotonically with increasing sequence length.

Figure 19A:
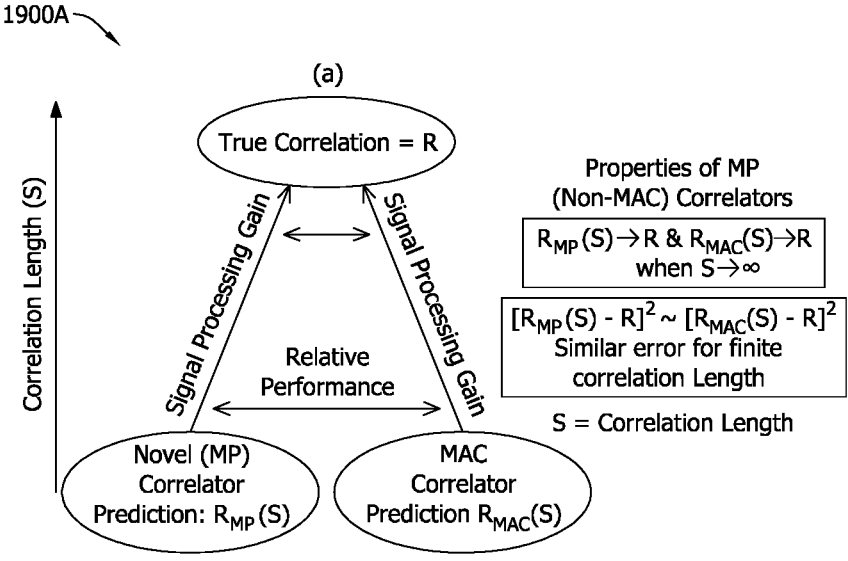
FIG. 19A illustrates comparison of cross-correlators with MAC based cross-correlator according to embodiments as described in the present disclosure.

FIG. 19A illustrates comparison 1900a of cross-correlators according to embodiments described herein with MAC based cross-correlator according to embodiments as described in the present disclosure. As described herein, cross-correlators can deliver signal-processing gains and errors for finite sequence length as a MAC based cross-correlator, while achieving higher TOPS/W and HDR.

Figure 19B:
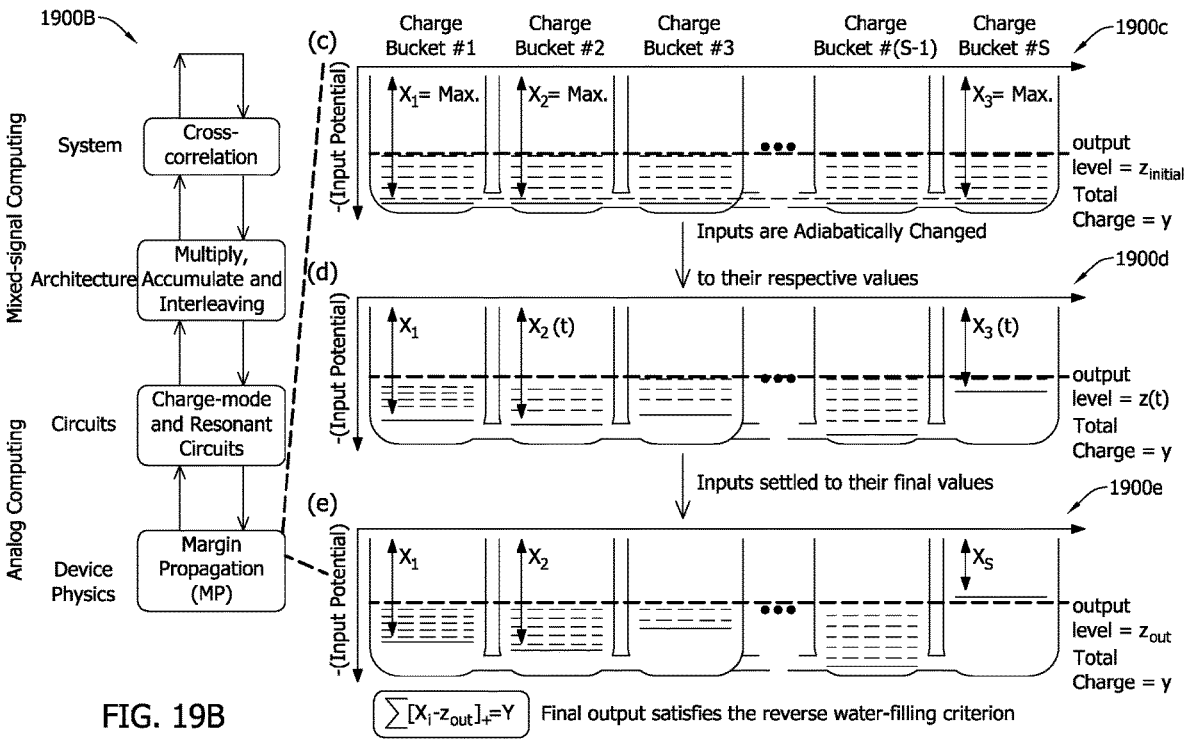
FIG. 19B illustrates analog bottom-up, top-design design approach for MP correlators and MP algorithms implemented on a charge-coupled device according to embodiments as described in the present disclosure.

FIG. 19B illustrates 1900b analog bottom-up, top-design design approach for MP correlators and MP algorithms implemented on a charge-coupled device according to embodiments as described in the present disclosure. Analog bottom-up, top-down co-design that exploits the computational redundancy in cross-correlation and computational primitives inherent in margin-propagation (MP) based devices/circuits. Additionally, FIG. 19B illustrates 1900c, 1900d, and 1900e MP algorithm implemented on a charge coupled device.

A MAC-based cross-correlator converges to the true cross-correlation (R) with increase in correlation length (or equivalently signal processing gain). Non-MAC based novel cross-correlator architectures as described in the present disclosure can also achieve similar signal processing gains with increase in correlation length, while following a different monotonic convergence path to the true cross-correlation, R. Importantly, such architectures can achieve similar errors to MAC correlators for finite correlation lengths as shown by 1900a. Additionally, or alternatively, such non-MAC based cross-correlator may be implemented in a more energy-efficient (higher TOPS/W) and/or in a more hardware-friendly manner (higher hardware dynamic range— HDR). Accordingly, the cross-correlators using a margin-propagation (MP) based analog computing paradigm can provide similar precision and dynamic range as a conventional MAC based cross-correlator while achieving higher TOPS/W and a superior HDR. The approach will require a bottom-up, top-down hardware-algorithm co-design providing a pathway for designing a cross-correlator.

A margin propagation (MP) technique as used currently in an analog computing paradigm and shown in FIG. 19B as 1900b only relies on universal conservation laws (charge, current, mass, energy etc.). This makes the approach scalable across different analog structures ranging from silicon transistors to microfluidic devices, scalable across different transistor biasing conditions and more robust to variations in temperature. Initially, a fixed amount of charge γ is introduced into the CCD as shown in FIG. 19B as 1900c. As the potential barriers are increased adiabatically, the charge in each of the potential wells may re-distribute itself as shown in FIG. 19B as 1900d. In the final state of computation, as shown in FIG. 19B as 1900e, the charge accumulated under different potential wells, $[X_i-z]+$, and a normalization level, z, is determined according to charge conservation following a reverse water-filling criterion, $\Sigma_{i=1}^{S}[X_i-z]+$, which may be represented as z=MP (X, γ)). Here [a]+ denotes a rectifying non-linearity and=a for a>0 and is=0 for a<=0. Hence, the structure functions as an analog computing device that produces a scalar output z=MP (X, γ) based on the input vector X=[X1, X2, . . . , XS] and a hyper-parameter γ. By choosing different forms of X1–XM, different functions can be approximated using the basic MP computational unit.

Even though potential wells have been used in this example, the basic MP computing paradigm can be implemented using other physical quantities (currents, mass, photons, energy) and hence can be mapped onto various devices. In some embodiments, and by way of a non-limiting example, a current-mode implementation of MP computational circuits can be used to design ultra-energy-efficient and bias scalable communication decoders and pattern matching systems. In the charge-mode MP computing unit described herein according to some embodiments can operate at the limits of energy-efficiency while achieving the speed and precision requirements.

Figure 20:
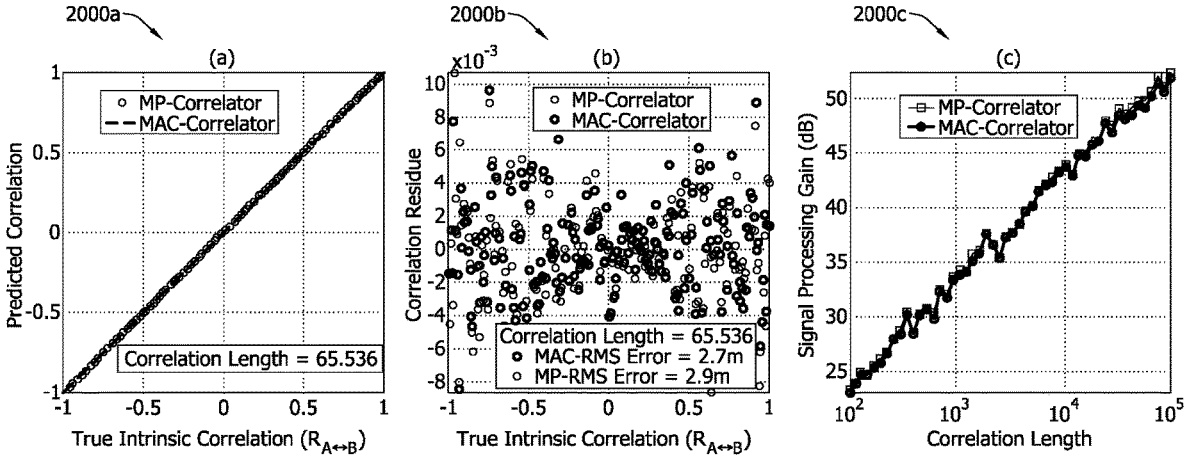
FIG. 20 illustrates simulations to demonstrate minimal to no degradation in estimating the correlation while using MP approximation compared to MAC operation according to embodiments as described in the present disclosure.

FIG. 20 illustrates simulations to demonstrate minimal to no degradation in estimating the correlation while using MP approximation compared to MAC operation according to embodiments as described in the present disclosure. In FIG. 20, 2000a describes comparison of estimated MP-correlation versus the MAC-correlation using a window length S=65536 when the true intrinsic correlation is varied; 2000b describes an error in predicted correlation by the MP-correlator and the MAC-correlator; and 2100c described signal processing gain of an MP-correlation and a MAC-correlator across varying correlation lengths.

In some embodiments, for two vectors A and B, a differential MP architecture that computes z+=MP ([A+B, −A−B], γ) and z−=MP ([A−B, −A+B], γ) can be used to approximate the inner-product between A and B according to $z_{out}=(z+-z-)\approx R_{A\leftrightarrow B}$, where $R_{A\leftrightarrow B}$ represents the true-intrinsic-correlation between A and B, thus realizing a correlation operation using only addition, subtraction and rectification. As the size of the vectors A and B become large, the approximation error grows smaller (e.g., $z_{out}=(z+-z-)\approx R_{A\leftrightarrow B}$ when size of A and B are large), thus making it a perfect tool for realizing ultra-efficient correlators with large correlation lengths, and high dynamic range. Based on simulations in MATLAB and device-aware simulations in Cadence that use the MP approach to determine correlation in two vectors, A and B with varying degrees of cross-correlation between them may be generated and, as shown in FIG. 20 as 2000a, compared for correlation using (i) ideal multiplier/adder block operating over a finite window length S as $$R(D) = \frac{1}{D}\sum_{i=1}^{D} a_i b_i,$$

and (ii) the charge-based MP techniques described herein.

In some embodiments, simulation results corresponding to the MP-based correlation show very little degradation compared to a MAC-based correlation. As shown in FIG. 20 as 2000b, the root-mean square (rms) residue of the MP-correlation is ≈2.9 m for a correlation length of 65,536, which is comparable with MAC-based correlation. Additionally, or alternatively, as shown in FIG. 20 as 2000c, the signal-processing gain achieved by an MP-based correlator closely matches with that of a MAC-based correlator. Accordingly, the results from FIG. 20 suggest that MP-computation represents an alternative modality to the commonly used MAC architecture for computing correlation, while resulting in similar precision and extremely high degree of power efficiency.

Figure 21A:
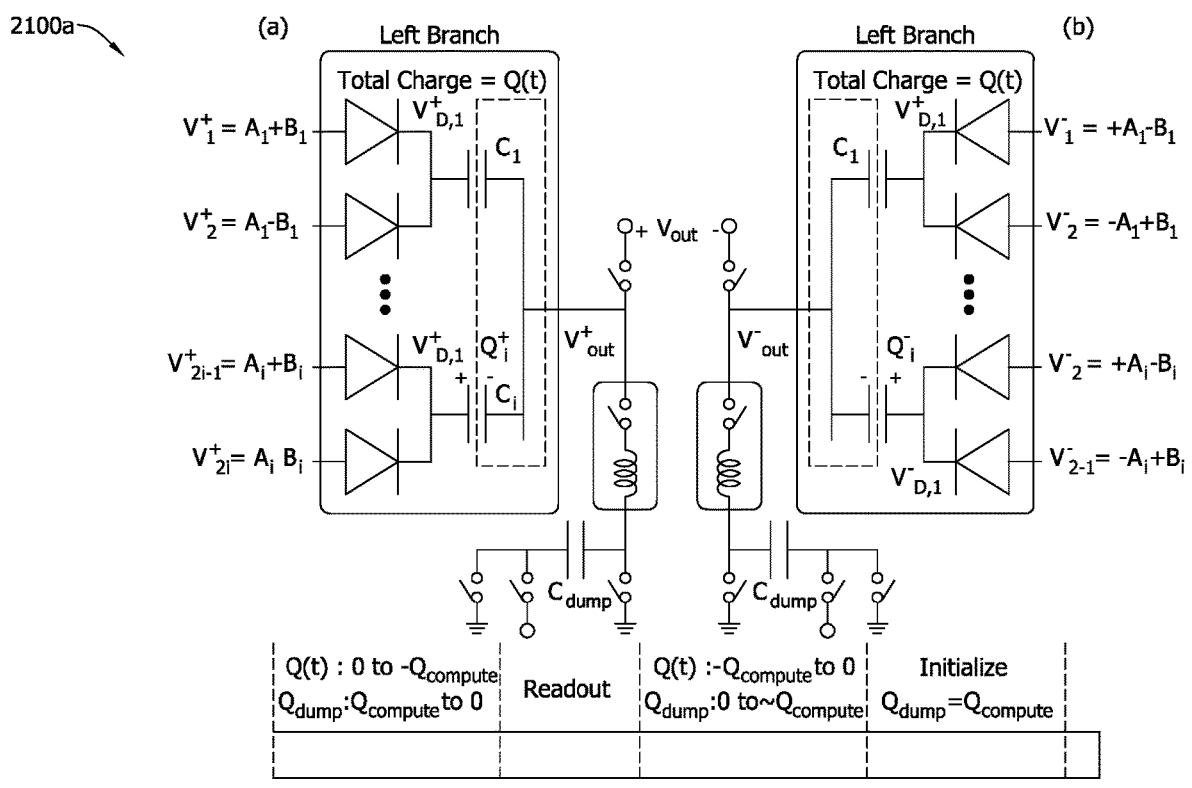
FIG. 21A illustrates a multiplier-free charge-based MP correlator unit realizing inner product of the input vectors in real-time according to embodiments as described in the present disclosure.
Figure 21B:
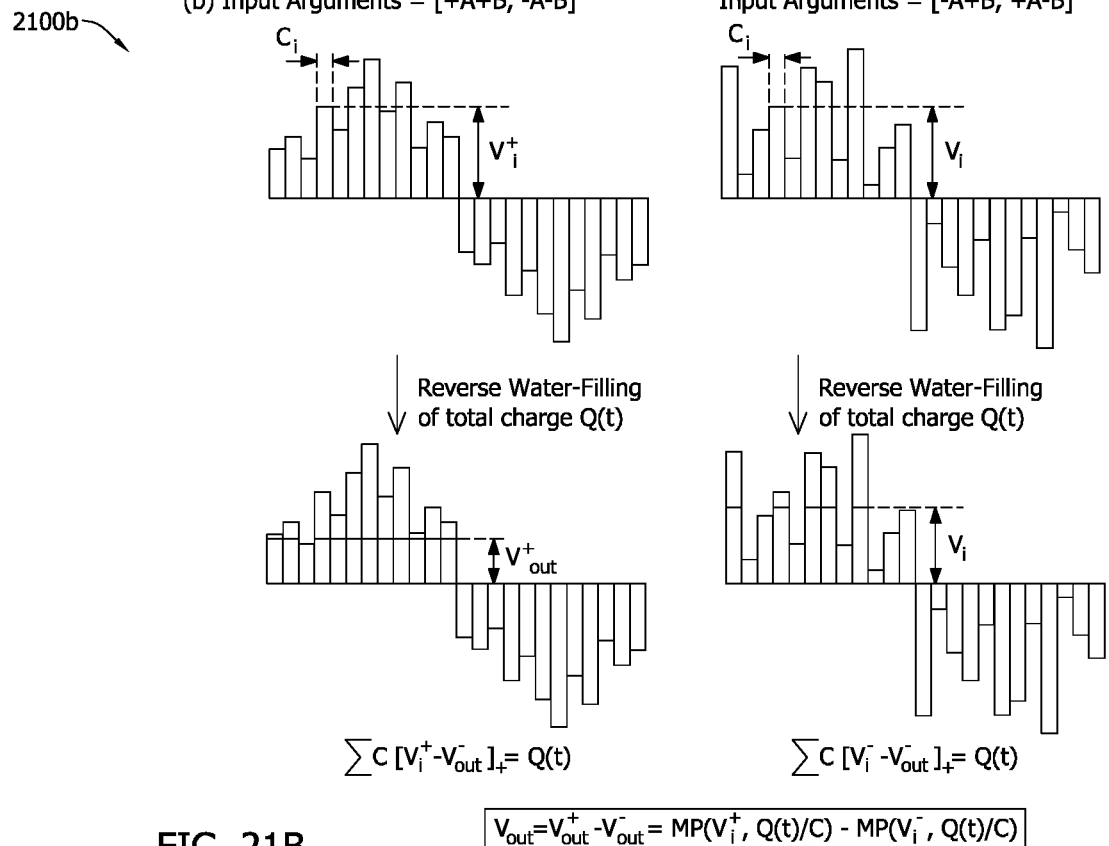
FIG. 21B illustrates charge distribution between the MP capacitors through reverse water-filling criterion according to embodiments as described in the present disclosure.
Figure 21C:
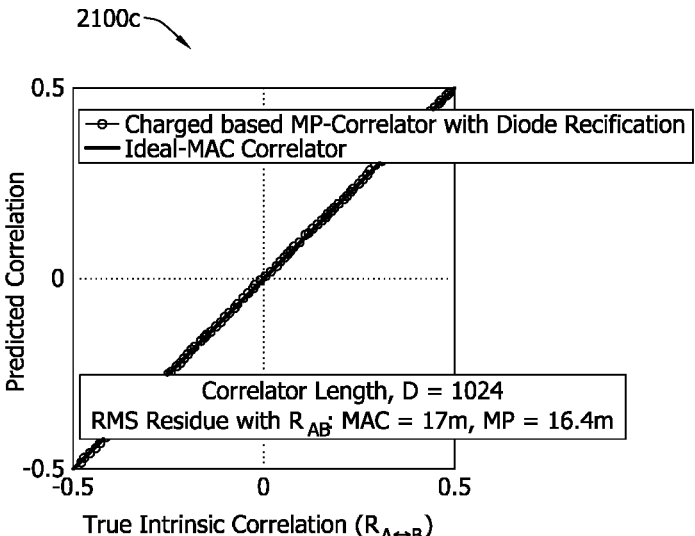
FIG. 21C illustrates predicted correlation of an ideal MAC correlator and a charge-based MP correlator according to embodiments as described in the present disclosure.

FIG. 21A illustrates a multiplier-free charge-based MP correlator unit 2100a realizing inner product of the input vectors in real-time according to embodiments as described in the present disclosure. FIG. 21B illustrates charge distribution 2100b between the MP capacitors through reverse water-filling criterion according to embodiments as described in the present disclosure. FIG. 21C illustrates predicted correlation 2100c of an ideal MAC correlator and a charge-based MP correlator according to embodiments as described in the present disclosure.

Conventionally MP-based vector multipliers are realized in digital and in analog using current conservation. While these approaches are energy efficient compared to conventional digital architectures, they still fall short of the desired energy efficiency requirements for improvement. Further, using a novel concept of MP-based calculation in charge domain with no static current draw, efficiency may be improved, and allow to operate near the fundamental limits of power efficiency. In some embodiments, as shown in FIG. 21A as 2100a, an MP-core where each of the argument to an MP-algorithm are driven at the input of the diodes (e.g., PDK-based diode connected FETs, PN junction diodes and/or custom Schottky diodes), for a total charge of −Q on the output nodes ($V_{out}$+ and $V_{out}$−), through circuit analysis and charge conservation, following can be derived.

$$\Sigma_{i=1}^{S}Q_i^+ = \Sigma_{i=1}^{S}C_i[V_i^+ - V_{out}^+]_+, \Sigma_{i=1}^{S}Q_i^- = \Sigma_{i=1}^{S}C_i[V_i^- - V_{out}^-]_+ \qquad \text{Eq. 1}$$

Where $\Sigma_{i=1}^{S}Q_i^+ = \Sigma_{i=1}^{S}Q_i^- = -Q$ is the total charge, [•]=max (•, 0) is the rectifying non-linear operation, S represents the total number of inputs to the charge-based MP core.

In a real implementation, the hard rectifying function [•], is very well approximated by the diode I-V characteristics which is a very-rapidly rising exponential. In some embodiments, and by way of a non-limiting example, Cadence Virtuoso based simulations using BISIM-3 diode models have shown no degradation in the overall performance compared to the MATLAB-based simulation using hard rectifying function. In some embodiments, Eq. 1 above can be simplified and the output voltage can be calculated to be $V_{out}^{\pm} = MP(v^{\pm}, Q)$, where the solution for eq. 1 is represented by the function MP (•), $v^{\pm}$ represents the input voltage vectors [$V_1^{\pm}$, $V_2^{\pm}$, . . . , $V_S^{\pm}$], C represents the value of capacitances, Q is the hyper-parameter and has an optimal value for a given S. The final output from the MP core can be expressed using Eq. 2 below.

$$V_{out} = V_{out}^+ - V_{out}^- = MP(v^+, Q) - MP(v^-, Q) \qquad \text{Eq. 2}$$

Eq. 2 above shows that when the input arguments $v^+$ and $v^-$ are chosen to [A+B, −A−B], and [−A+B, +A−B], the resultant output $V_{out\ may}$ result in an estimation of the intrinsic correlation between vectors A and B.

In some embodiments, at the start of the compute phase, the output node starts with a total of zero charge. Hence, Q(0)=0 and the output voltage will just be equal to the highest value of the input arguments, commonly known as the winner takes all situation. Now in the compute phase, charge is drawn from the output node adiabatically, using bucket brigade or resonant charge transfer as shown in FIG. 21A as 2100a. Thus, reverse-water filling criterion on the total charge can be enforced as shown in FIG. 21B as 2100b. Therefore, the total charge stored on any capacitor can be expressed as Ci [$V_i^{\pm} - V_{out}^{\pm}$]+. Accordingly, the output voltage as a function of time can be expressed as Eq. 3 below.

$$V_{out}(t) = V_{out}^+(t) - V_{out}^-(t) = MP(v^+, Q(t)) - MP(v^-, Q(t)) \qquad \text{Eq. 3}$$

where Q(t) represents the total amount of the charge induced onto the output nodes. Once Q(t)=$Q_{compute}$ (optimal charge for a size S), the charge transfer operation is stopped, and output ($V_{out}$) is read out. At the end of the compute phase, the charge on the output ($Q_{compute}$) node is transferred back to the dump capacitor, $C_{damp}$, thus realizing an extremely efficient compute operation using the concept of charge-recycling operation. Therefore, the power consumption of the device is purely limited by the leakage current through the diodes and parasitic losses during the charge-recycling operation.

In some embodiments, a 1024-element analog correlator can be implemented in Cadence Virtuoso (an industry standard circuit simulator) using PN-junction diodes and 10 fF compute capacitors. And a correlation calculated by the charge-based MP-correlator can accurately predict intrinsic correlation of input vectors, as shown in FIG. 21C as 2100c. In some embodiments, the precision of the MP-calculation is invariant to the absolute value of the total charge $Q_{total}$, as long as the total charge is equal in the left branch (input arguments are [+A+B, −A−B]) and right branch (input arguments are [+A−B, −A+B]) as shown in FIG. 21A as 2100a. However, due to thermal noise, the compute capacitors cannot be reset to zero charge leading to ambiguity in the total charge and difference between the total charge in left and right branches. This charge ambiguity leads to noise in computed output voltage, resulting in a noise floor to the computation. The output node voltage can be approximated as, $$V_{out,noise} = \sqrt{\frac{kT}{c} \times \left(\frac{1}{S_{left}} + \frac{1}{S_{right}}\right)} = \sqrt{\frac{kT}{c} \times \left(\frac{1}{F_{left}} + \frac{1}{F_{right}}\right)},$$

where $S_{left}$ and $S_{right}$ represent the number of diodes that are forward biased in left and right branches respectively as shown in FIG. 21A as 2100a, S represents the length of input vectors, and $F_{left}=S_{left}/S$ and $F_{right}=S_{right}/S$ are the sparsity coefficients that are determined by the hyper parameter $Q_{compute}/C$ (usually $0.05 < F_{left}$, $F_{right} < 0.5$), C represents the value of the compute capacitor, k represents the Boltzmann constant, and T represents the absolute temperature. Finally, the signal-to-noise ratio (SNR) or hardware dynamic range due to noise ($HDR_{noise}$) can be expressed as Eq. 5

$$HDR_{noise} = 10\log_{10}\left(\frac{v_{out,rms}^2}{v_{out,noise}^2}\right) \approx$$

$$20\log_{10}([A, B]rms) + 10\log_{10}(S) - 10\log_{10}\left(\frac{kT}{c}\left(\frac{1}{F_{left}} + \frac{1}{F_{right}}\right)\right)$$

Eq. 5 where $[A, B]_{rms}$ is rms value of the input voltage.

As described herein, the noise performance of MP-compute block improves by using a larger compute capacitance. From eq. 5, it can be seen that the "hardware dynamic range" of the MP computation improves with correlation length due to the inherent averaging of the noise terms among the various capacitor elements. Further, the dynamic range improvement is the true improvement in MP-hardware precision and is equivalent to the improvement in "Hardware Dynamic Range" and corroborated using MATLAB simulations of the MP-correlator in the presence of sampling noise on the compute capacitors (e.g., kT/C noise).

Figure 22A:
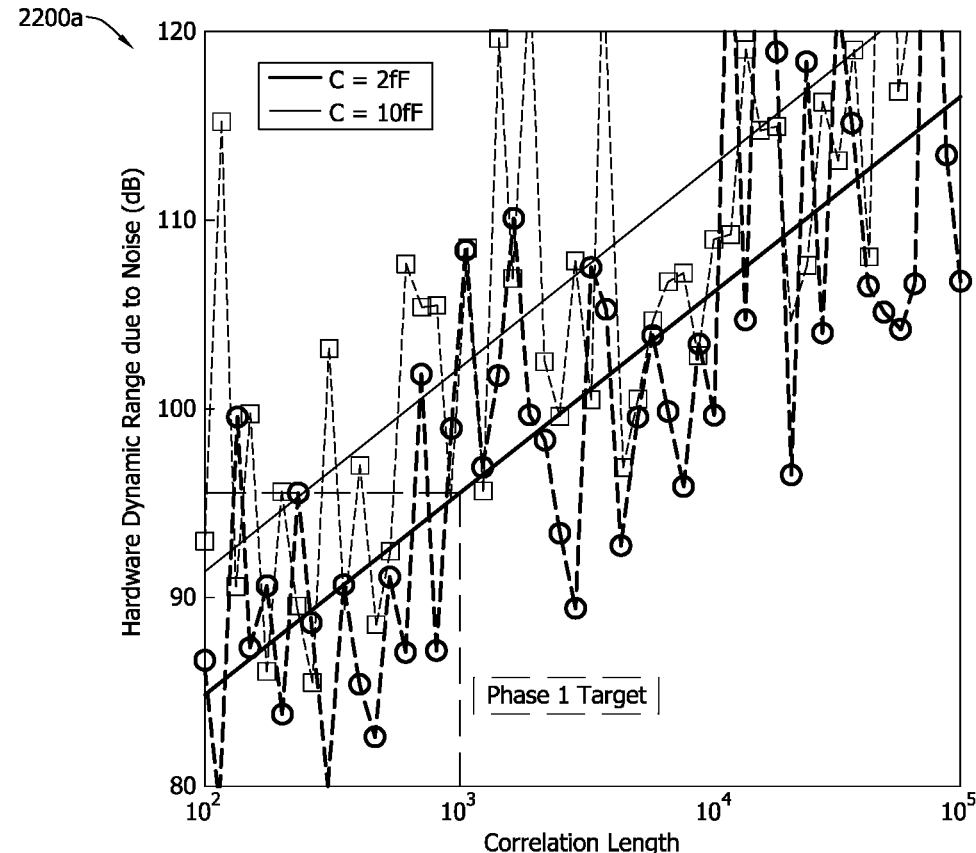
FIG. 22A illustrates a hardware dynamic range due to thermal noise according to embodiments as described in the present disclosure.
Figure 22B:
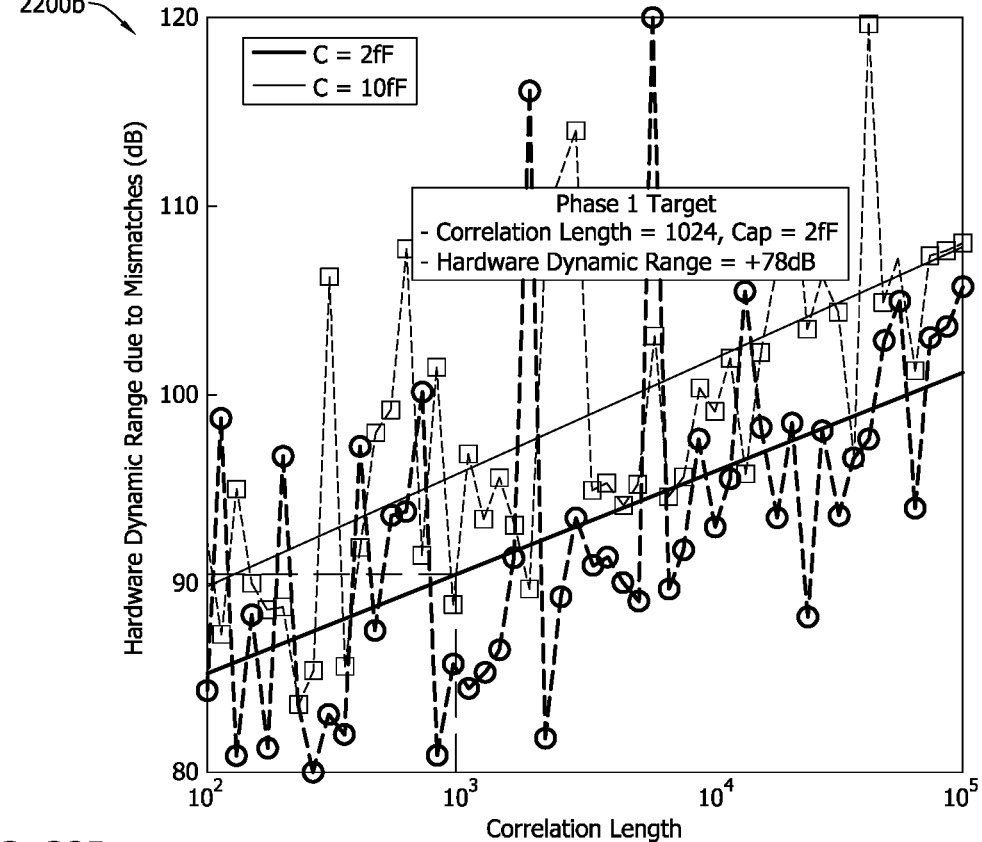
FIG. 22B illustrates a hardware dynamic range due to the effect of capacitor mismatches with a mismatch coefficient according to embodiments as described in the present disclosure.
Figure 22C:
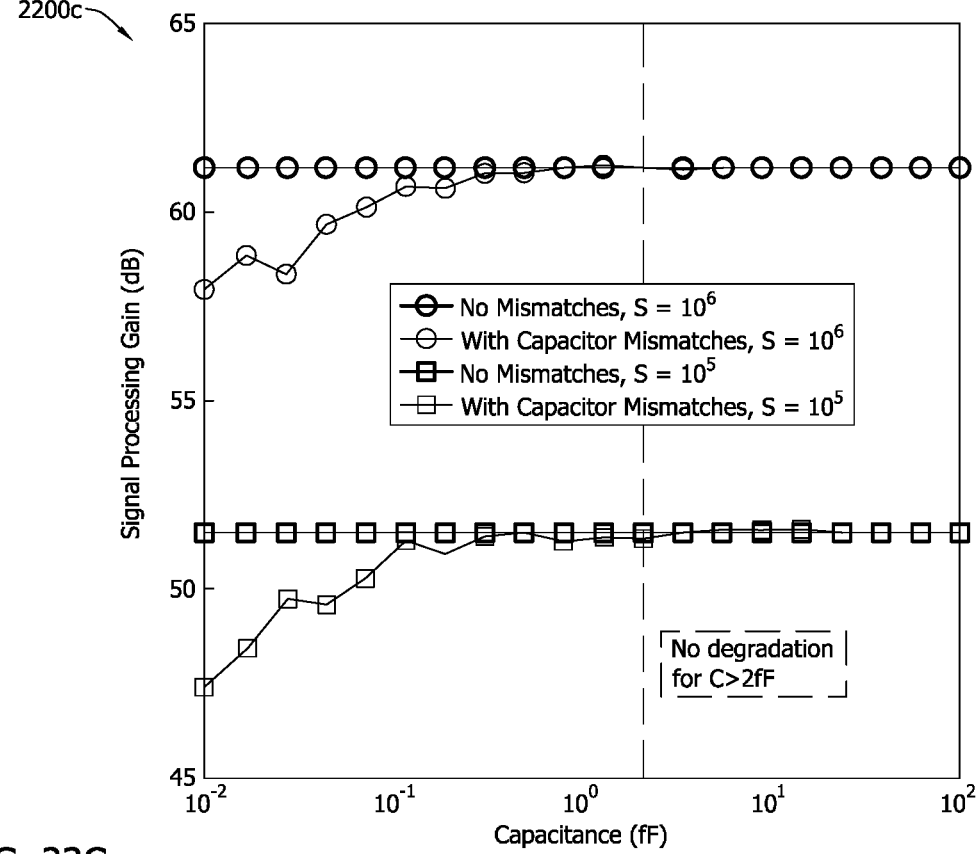
FIG. 22C illustrates effect of noise and capacitor mismatches on signal processing gain across varying capacitor values according to embodiments as described in the present disclosure.

FIG. 22A illustrates a graph 2200a for a hardware dynamic range due to thermal noise according to embodiments as described in the present disclosure. FIG. 22B illustrates a graph 2200b for a hardware dynamic range due to the effect of capacitor mismatches with a mismatch coefficient according to embodiments as described in the present disclosure. FIG. 22C illustrates a graph 2200c for effect of noise and capacitor mismatches on signal processing gain across varying capacitor values according to embodiments as described in the present disclosure.

In some embodiments, as shown in FIG. 22A, the HDR improves, even in the presence of computer-capacitor sampling noise, with higher capacitance and with longer correlation length. By way of a non-limiting example, $HDR_{noise}=+95$ dB may be expected using 2 fF compute capacitor and a correlation length of 1024.

In some embodiments, another important non-ideality that is evaluated is effect of capacitor mismatches. In presence of capacitor mismatches, from eq. 1, the output voltage can be expressed as eq. 6 below.

$$V_{out} \approx$$

$$V_{out,w/o\ mismatch} + \sum_{i=1}^{2S}\frac{\delta C_i^+}{C}[V_i^+ - V_{out}^+]_+ - \sum_{i=1}^{2S}\frac{\delta C_i^+}{C}[V_i^+ - V_{out}^+]_+$$

Eq. 6

In Eq. 6 above, $\delta C_i^-/c$ represents the fractional change in the capacitance value due to mismatches. Further, $[V_i^{\pm}-V_{out}^{\pm}]$ is a positive quantity $\forall_i$ while $\delta c_i^{\pm}$ is a random number with Gaussian distribution. Therefore, for large values of S, the mismatch term will be averaged out to a smaller value. The hardware dynamic range, in the presence of mismatches, can be bounded as Eq. 7 below.

$$HDR_{mismatch} \approx 20\log_{10}\left(\frac{c_i}{\delta c_{rms}}\right) + 10\log_{10}(S) - 3dB$$

Eq. 7

Hence, using a larger capacitance improves the hardware dynamic range of the charge-based MP-device by minimizing the effect of mismatches and thermal noise, at the expense of higher power consumption due to the usage of larger portion of $Q_{compute}$. Similar to the effect of noise, the impact of capacitor mismatches are reduced for longer correlation lengths. We corroborated our theory with simulations by assuming a pessimistic capacitor mismatch coefficient $A_{\delta C/C}=10\%\times\mu m$ (typically ranges from $1\%-2\%\times\mu m$) and a capacitance density of 1 fF/μm2. Accordingly, as shown in FIG. 22B as 2200b, in the presence of capacitor mismatches, the hardware dynamic range increases with higher capacitor value and longer correlation length. It can be seen that mismatch has a higher impact on hardware dynamic range compared to thermal noise. In some embodiments, and by way of a non-limiting example, a $HDR_{mismatch}=+78$ dB when using 2 fF compute capacitor and a correlation length of 1024 may be expected.

In some embodiments, the total dynamic range of the MP-compute system can be expressed as Eq. 8 below.

$$HDR_{correlator} =$$

$$10\log_{10}\left(\frac{1}{10^{\frac{HDRnoise}{10}} + 10^{\frac{-HDR_{mismatch}}{10}}}\right) \approx HDR_{mismatch}$$

Eq. 8

Accordingly, as shown in FIG. 22C as 2200c, mismatches and noise have negligible effect on signal processing gain when using compute capacitance >=2 fF. Further, the precision of the MP-calculation is data invariant (e.g., precision does not depend on the nature of the input data, such as uniform distribution, Gaussian distribution, etc. Additionally, the MP-calculation precision is invariant to the absolute value of the total charge $Q_{total}$, as long as the total charge is equal in the left branch (e.g., input arguments [+A+B, −A−B]) and right branch (e.g., input arguments [−A+B, +A−B]) as shown in FIG. 20A. Further, the performance remains unchanged across a large range of $Q_{compute}$ ranging from $Q_{compute}$=0.1×S×C×[A, B]$_{rms}$ to $Q_{compute}$=0.5×S×C× [A, B]$_{rms}$, where [A, B]$_{rms}$ represents the rms value of the input vectors, S represents the input vector length, and C represents the value of the compute capacitor.

In some embodiments, in a fully digital approach, correlating of two vectors of length S with an N-bit precision requires a total of S N-bit multiplications and S N-bit additions. Assuming an N-bit multiplication require $N^2$ operations, the total no of operations required to correlate two N-bit sequences with a length of S require, a total of $(N^2+N)×S$ operations. To realize the same operation using a charge-based MP-compute requires a total energy of $2Q_{compute}×V_{DD}$ for the computation as shown in FIG. 21A. Additionally, at the end of each computation, all the 2S compute capacitors (S on left branch and S on the right branch) should be reset using switches, and the total energy required for clocking the reset is $Q_{SW,reset}×V_{DD}$=2S× $C_{SW,reset}V_{DD}^2$, where $C_{SW,reset}$ is the gate capacitance of one reset switch. From eq. 8, the equivalent number of bits for out analog computation can be calculated as Eq. 9 below.

$$N_{bits} = \frac{HDR_{correlator}}{6} \approx \frac{HDR_{mismatch}}{6} \qquad \text{Eq. 9}$$

The Eq. 9 above uses the relation $HDR_{noise}$>>$HDR_{mismatch}$, and from which the efficiency of our computation can be calculated to as shown in Eq. 10 below.

$$\left(\frac{TOP_s}{\text{Joule}} \text{ or } \frac{TOP_s}{s \times W}\right)_{compute} =$$

$$\frac{\text{No. of Equivalent } Digitsl\ TOP_s}{\text{Computation Energy}} = \frac{(N_{bit}^2 + N_{bit}) \times S}{(2Qcompute + Qreset)VDD} \qquad \text{Eq. 10}$$

From eq. 7 through eq. 10, it can be concluded that $N_{bit}$ (or the Hardware Dynamic Range of the correlator) improves with longer correlator lengths, resulting in increased power efficiency of the MP-compute blocks. However, scaling to very large correlation lengths (>10,000) can add large parasitic capacitances at the output nodes, potentially limiting hardware dynamic range and signal processing gain of the MP-correlator. As a risk mitigation measure, the MP-correlator block may be cascaded with an MP-adder as shown in FIG. 17. The cascaded MP-correlator-accumulate architecture may enable scaling to large correlation lengths of our analog correlator.

Figures 23A, 23B, 23C:
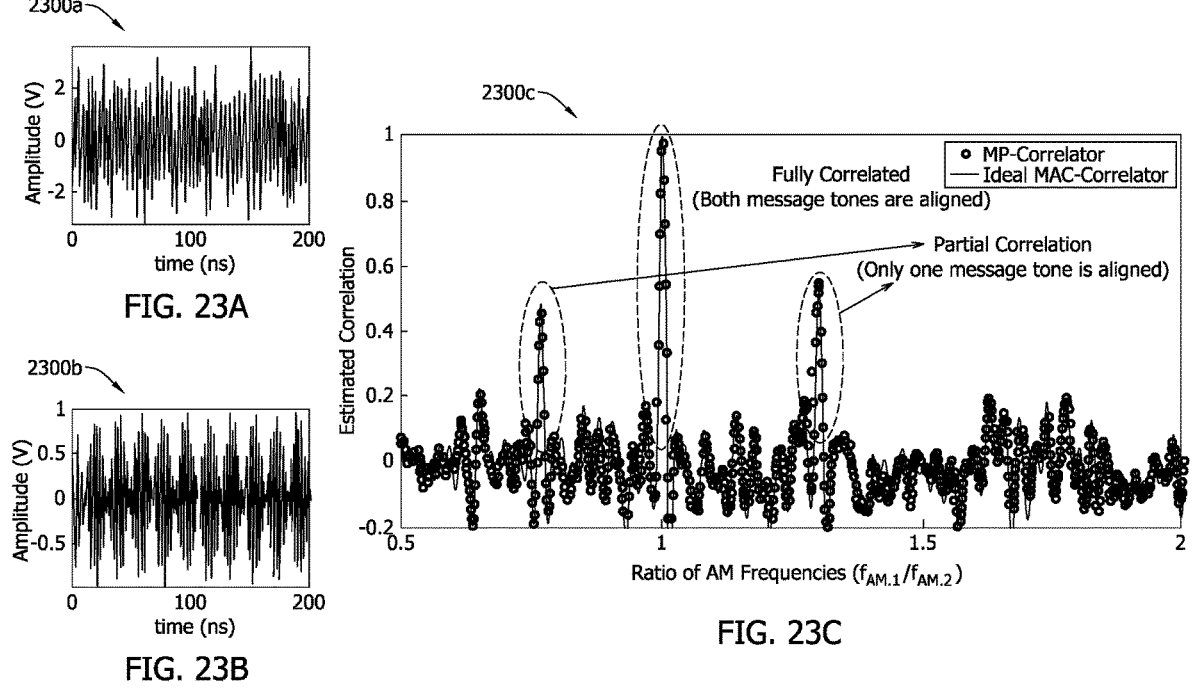
FIG. 23A illustrates a time-domain waveform of an input amplitude modulated signal with a 2-sinusoidal message signal buried under noise with a signal-to-noise-ratio of 0 dB according to embodiments as described in the present disclosure.
FIG. 23B illustrates a time domain waveform of an amplitude-modulated pilot-signal with varying message-signal frequency according to embodiments as described in the present disclosure.
FIG. 23C illustrates correlation predicted by an MP-correlator and a MAC-based correlator for a correlation length of 1024 elements across varying message-signal frequency according to embodiments as described in the present disclosure.

FIG. 23A illustrates a time-domain waveform 2300a of an input amplitude modulated signal with a 2-sinusoidal message signal buried under noise with a signal-to-noise-ratio of 0 dB according to embodiments as described in the present disclosure. FIG. 23B illustrates a time domain waveform 2300b of an amplitude-modulated pilot-signal with varying message-signal frequency according to embodiments as described in the present disclosure. FIG. 23C illustrates correlation predicted by an MP-correlator and a MAC-based correlator for a correlation length of 1024 elements across varying message-signal frequency as 2300c according to embodiments as described in the present disclosure.

In some embodiments, MP-correlator performance can be evaluated using realistic analog data such as an amplitude-modulated analog signal that is buried under noise with 2-sinusoidal message signal (m(t)=cos($2\pi f_{AM}$t)+cos (2.6π$f_{AM}$t), where $f_{AM}$=100 MHz) with an SNR of ≈0 dB, carrier frequency of 2 GHz, and a sampling rate of 5 GHz as shown in FIG. 23A as 2300a. This noisy input signal is correlated with an amplitude-modulated pilot signal with varying message signal frequency as shown in FIG. 23B as 2300b, and thereby changing the correlation between the noisy-input and the pilot signals. As shown in FIG. 23C as 2300c, the MP-correlator results closely match the correlation estimated by an ideal-MAC based correlator, highlighting the robustness of the MP-calculation to the input data type.

In some embodiments, along with the analog correlating block, generation of delayed analog samples and distribution of these delayed analog samples to the analog compute block are very critical and should be highly power efficient in-order to achieve high energy efficiency in the overall analog correlator. In semiconductor ICs, achieving large analog delays required by the analog correlators using passive LC delay lines or active Gm-C delays is fundamentally challenging from an area, loss, power consumption, noise, and linearity standpoint.

Figure 24A:
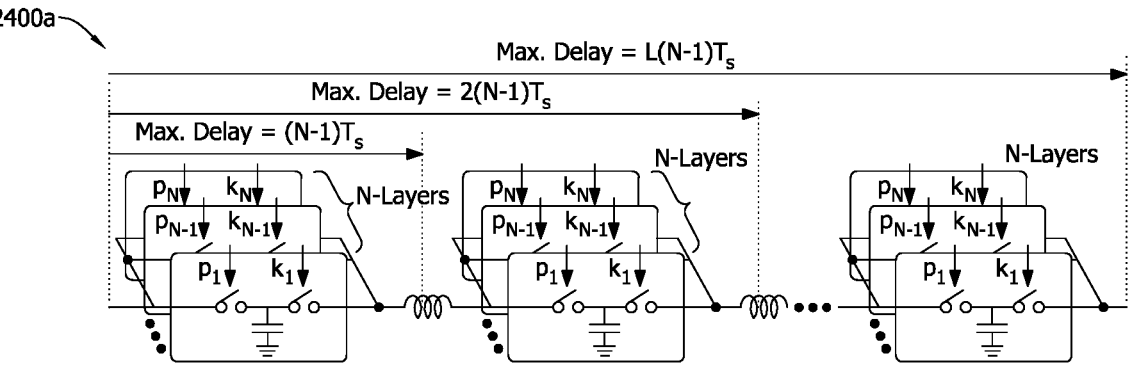
FIG. 24A illustrates cascaded multipath switched-capacitor delays with resonant charge transfer according to embodiments as described in the present disclosure.
Figure 24B:
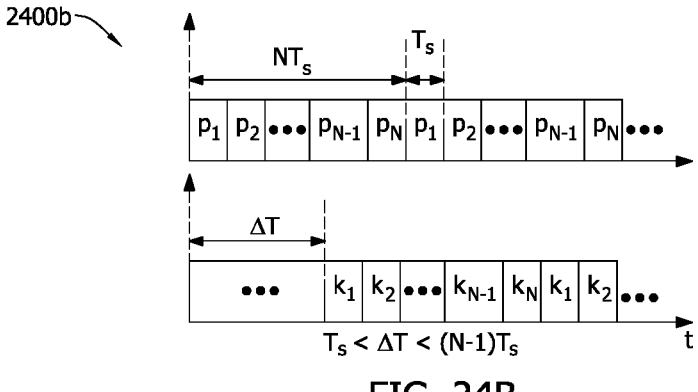
FIG. 24B illustrates a timing diagram of the time-interleaved multipath switch capacitor delays according to embodiments as described in the present disclosure.
Figure 24C:
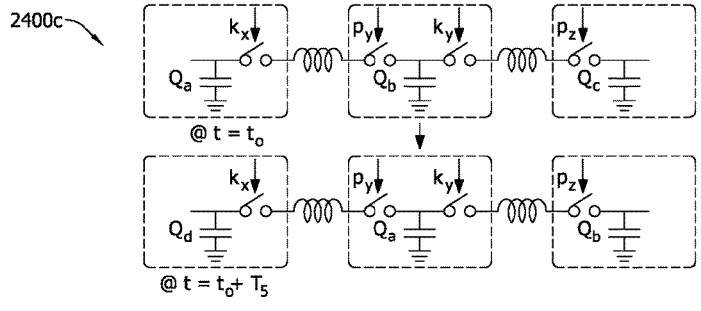
FIG. 24C illustrates an evolution of the energy transfer from one shunt capacitor to the next through a resonant inductor according to embodiments as described in the present disclosure.

FIG. 24A illustrates cascaded multipath switched-capacitor delays 2400a with resonant charge transfer according to embodiments as described in the present disclosure. FIG. 24B illustrates a timing diagram 2400b of the time-interleaved multipath switch capacitor delays according to embodiments as described in the present disclosure. FIG. 24C illustrates an evolution of the energy transfer from one shunt capacitor to the next through a resonant inductor as 2400c according to embodiments as described in the present disclosure.

In some embodiments, Quasi-Electrostatic Switched-Capacitor Delays, or the concept of electrostatic delay lines, where N-path switched-capacitor networks can be used to exhibit a low-loss broadband response with a true-time delay determined by the clock delay between the input and output switch sets. By way of a non-limiting example, 2-port commutated multipath networks are realized using N identical branches including a shunt capacitance in each branch of each sub-block of a circuit as shown in FIG. 24A as 2400a. The input set of switches may be controlled using non-overlapping pulses each having a period of $NT_s$ and pulse width of $T_s$. The output switches are thus delayed with respect to the input set by time ΔT>$T_s$ as shown in FIG. 24B as 2400b. Due to the staggered commutation, switches in any given branch are not closed at the same time. Accordingly, when the device with the quasi-electrostatic delay regime (Z0C≈$T_s$) is operated, the structure behaves as a low-loss, ultra-broadband electrostatic delay element and results in an overall true-time delay equal to the clock staggering between the left and right switches. A single delay element with N-interleaved paths as shown in FIG. 24A as 2400a can store sampled inputs of previous N−1 samples. Thereby, a maximum delay of ≈(N−1)$T_s$ can be imparted with an alias aliasing-free bandwidth of $f_s$/2 within a compact footprint that is orders of magnitude smaller/ lower power compared to other on-chip delay alternatives. Alternatively, the N-capacitors within the delay element store previous (N−1) samples across them.

In some embodiments, cascaded N-path switched capacitor delays with resonant charge transfer may be generated using an N-path structure that simultaneously stores previous (N−1) samples across them. Therefore, increasing the number of interleaved paths increases the number of samples stored. However, in practice for a sampling frequency of few GHz (e.g., 5 GHz), the maximum number of interleaved paths may be limited to ≈128 due to the insertion losses from the switch and layout parasitic, and complexity of the clock generation (e.g., signals p1-pN). Therefore, delays >128 sample delays may be realized by cascading multiple delay units in series.

In some embodiments, coupling these N-path delay elements through a resonant inductor may result in complete charge/energy transfer from one capacitor to the next capacitor with no wastage in the sampled energy as shown in FIG. 24C as 2400c. When the switches $k_x$ and $p_y$ are closed, the inductor along with the two capacitors forms an LC resonant tank with a period of $2T_s$, therefore the charge on the capacitor $C_1$, completes shuffle to capacitor $C_2$ after a time $T_s$, at which point the switches $k_x$ and $p_y$ are opened, thus realizing a complete charge transfer between the capacitors. Alternatively, bucket-brigade structures can also lead to complete charge transfer between the capacitors, however, bucket brigade circuits require high frequency analog amplifier thereby increasing the power consumption of the delay element.

In some embodiments, novel ways of cascading switched-capacitor circuits for complete energy transfer to realize extremely large delays with high bandwidths and consequently realizing the correlation leveraging the delayed samples may be based on charge-based margin propagation—analog signal processor (MP-ASP) unit, as such an analog correlator with 1024 samples requires a total of 1024 samples. This can be generated using 8 cascade of 128-path delay elements, thus resulting a total analog delay of $8×128T_s=1024T_s$.

Figure 25:
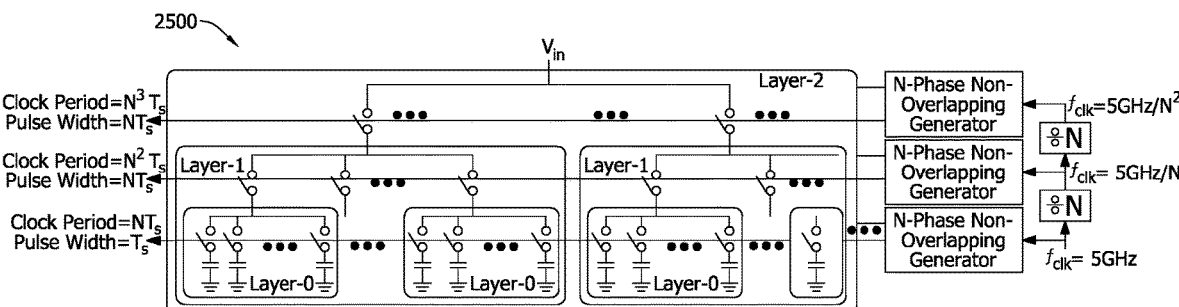
FIG. 25 illustrates an architecture of a tree-distribution based switched capacitor sampler using a tree structure with N parallel branches and a depth of 3-layers according to embodiments as described in the present disclosure.

FIG. 25 illustrates an architecture 2500 of a tree-distribution based switched capacitor sampler using a tree structure with N parallel branches and a depth of 3-layers according to embodiments as described in the present disclosure. In some embodiments, as an alternative to the cascaded delay elements with resonant clocking, the N-path tree-distribution based delay generation scheme, as shown in FIG. 25 as 2500, may include a unit block that is an N-phase time-interleaved switched capacitor sampler which is driven using an N-phase non-overlapping clocks with period of $NT_s$ and pulse width of $T_s$, which is layer-0. By way of a non-limiting example, $T_s=0.2$ ns is the sampling period of the correlator. In layer-1, N copies of the layer-0 blocks are interfaced through N non-overlapping switches that are clocked with a period of $N×NT_s$ and a pulse width of $NT_s$. Due to the series connection of the switches and frequency division between the layer-0 and layer-1 switches, the $N^2$ capacitors in layer-1 are connected to the output with a period of $N^2T_s$ and a pulse width of $T_s$. Furthermore, layer-3 may be added with clocking period of $N^3T_s$ and pulse width of $N^2T_s$, which may result a total of $N^3$ capacitors that are clocked at a period of $N^3T_s$ with a pulse width of $T_s$. Thus, the depth of 3-layers may result in delayed samples from 0 to $N^3T_s$. Similarly, extending this to a depth of M-layers would results in delayed samples from 0 to $N^M T_s$.

Such a tree architecture greatly reduces the switch parasitic at the input node and eases the clock generation required for delayed samples, enabling the generation of delayed samples required for large correlation lengths. For instance, an analog correlator with 1024 samples requires a total of 1024 delayed samples, if implemented using a regular time-interleaved sampler with one-layer, a 1024 non-overlapping clock generator is required and a total of 1024 switches may be connected to the input node, making it an impractical solution both from clock generation and parasitic standpoint. On the other hand, when implemented using the proposed tree-distribution scheme, a total of 1024 delayed samples can be generated using 2-layers of 32-phase samplers, thus only required 32-phase non-overlapping clock generation and only 32-switches are connected at the input node. Therefore, enabling scaling to a much large delays without huge performance penalty may be achieved. For example, a correlation length of S=65536 can be implemented using 16-phase non-overlapping unit cells with a tree depth of 4.

In some embodiments, for the purpose of the power consumption estimation, a 2-layer tree-architecture may be considered. In the tree-architecture the clocking power consumption is dominant by the switches in the lowest level. Through ANDing clocks of the layer-1 and layer-2 switches, for a correlation length of S and a switch parasitic of $C_{sw}$, the total energy required for sampling S samples would be $2C_{sw}×S×V_{DD}^2$. For a sampling capacitance of 100 fF and the switch technology with $R_{on}C_{off}=100$ fs, $C_{sw}$ can be estimated to be ≈0.5 fF. Therefore, the power efficiency associated with data sampling and distribution can be approximated to be using Eq. 11 below, where $\beta_{Driver}>1$ is an empirical factor to account the DC power consumption of the drivers clocking the sampling switches. In some embodiments, and by way of a non-limiting example, $\beta_{Driver}≈4$-5 may be preferred when conventional clocking methods are used.

$$\left(\frac{TOP_s}{\text{Joule}} \text{ or } \frac{TOP_s}{s \times W}\right)_{delay} = \qquad\qquad \text{Eq. 11}$$

$$\frac{\text{No. of Equivalent } Digits \text{l } TOP_s}{\text{DC Energy for sampling}} = \frac{\left(N_{bit}^2 + N_{bit}\right) \times S}{\beta \text{Driver}\left(2Csw \times S \times V_{DD}^2\right)}$$

Figure 26:
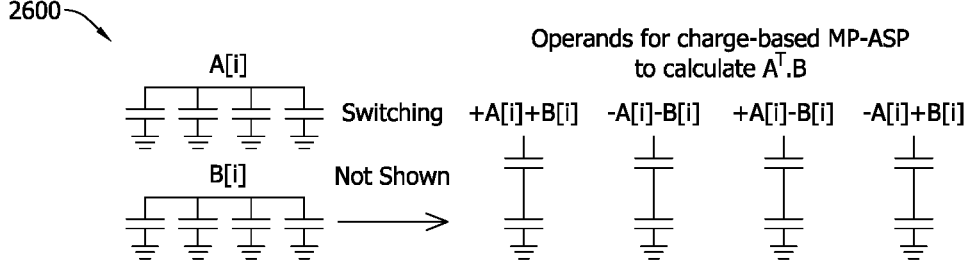
FIG. 26 illustrates MP-compute input operand generation through capacitor stacking and reverse capacitor stacking according to embodiments as described in the present disclosure.

FIG. 26 illustrates MP-compute input operand generation 2600 through capacitor stacking and reverse capacitor stacking according to embodiments as described in the present disclosure. In some embodiments, the operands are fed into the MP-compute block are the sum and differences of the input vectors whose inner product needs to be evaluated, for example, operands of [+A+B], [−A−B], [−A+B], and [+A−B] are required to calculate the inner product of two vectors (A and B) using MP-compute. The addition and subtraction operations on the sampled input voltages can be realized using active components, however, active components add high power consumption, noise, and non-linearity. To avoid the use of actives, the required addition and subtraction operations may be realized through capacitor stacking. The concept of capacitor stacking in switched capacitor delay lines in self-interference cancelers may be used to realize passive voltage gain and consequently cancel larger inference at the receiver input.

In some embodiments, during the sampling phase, the input voltages are sampled onto multiple parallel capacitors, as shown in FIG. 26, which separated and stacked upon each other in the direct and reverse order, thus realizing addition and subtraction operations required for the operand generation. The output voltages of the stacked-capacitor sets will be fed into the MP-compute block that calculates the inner product of the input vectors.

In some embodiments, in order to further improve linearity in the context of non-ideal diode characteristics, gate leakages, non-linearities in CMOS switches and close-in/ flicker noise, data shuffling may be implemented to leverage dynamic-element averaging to overcome mismatch. As described herein, energy-efficiency is inversely proportional to the total compute capacitance in the MP-block. While the smallest feasible capacitance is limited by matching as shown in FIGS. 22A-C, increasing the capacitance increases power consumption, area, non-idealities due to charge leakage in devices as well as power consumption of clock driver circuits.

Figure 27A:
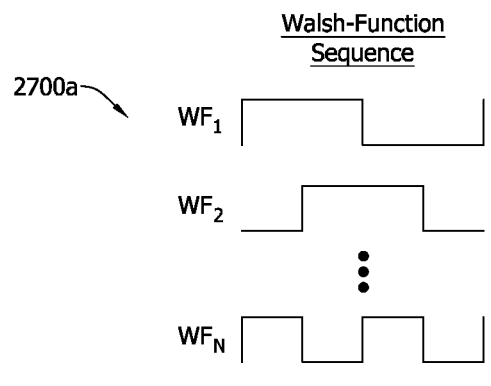
FIG. 27A illustrates Walsh-function selection for modulated inputs according to embodiments as described in the present disclosure.
Figures 27B, 28:
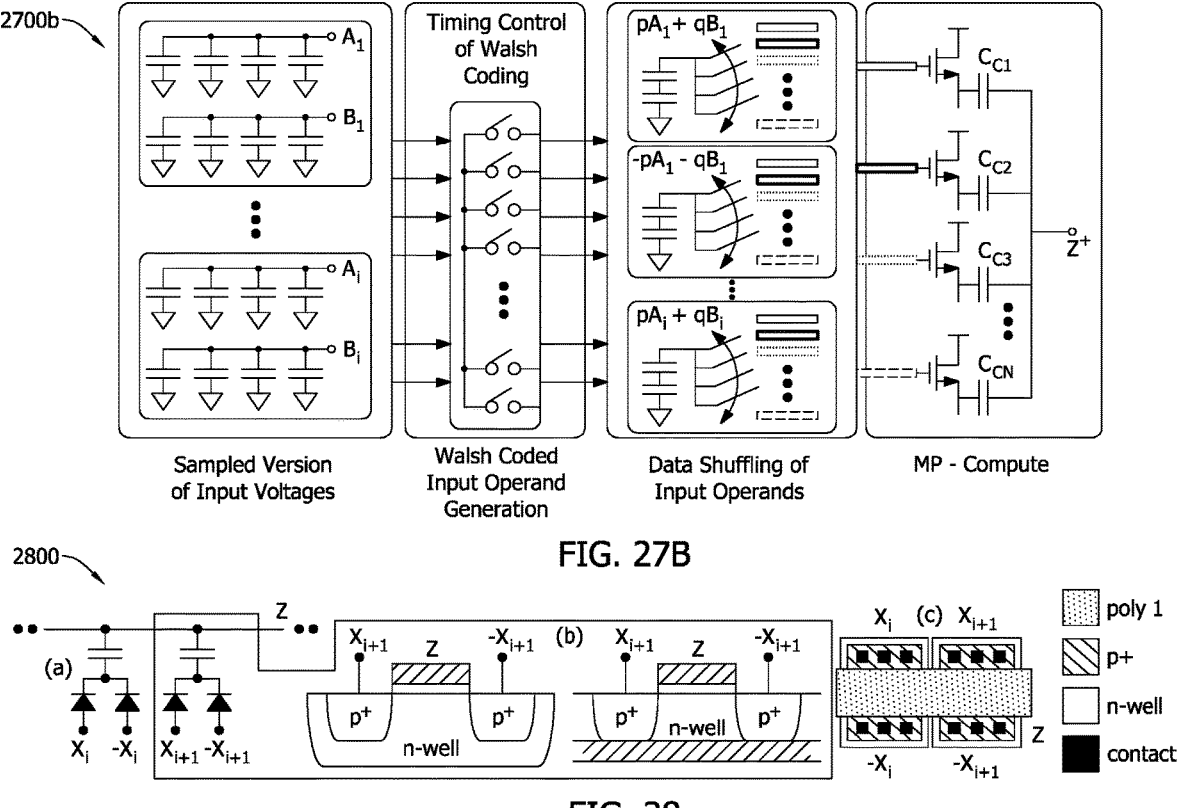
FIG. 27B illustrates data shuffling and WF-seq modulation to improve hardware dynamic range in the presence of mismatch and leakage according to embodiments as described in the present disclosure.
FIG. 28 illustrates device level implementation and optimization of MP-compute according to embodiments as described in the present disclosure.

FIG. 27A illustrates Walsh-function selection as 2700a for modulated inputs according to embodiments as described in the present disclosure. FIG. 27B illustrates data shuffling and WF-seq modulation as 2700b to improve hardware dynamic range in the presence of mismatch and leakage according to embodiments as described in the present disclosure.

In some embodiments, capacitance mismatches can be mitigated by data shuffling where the analog correlation is computed multiple times with shuffle inputs, averaging the mismatch as shown in FIGS. 27A and 27B. In some embodiments, the charge for the computation is drawn from the input capacitors storing the operands. In the case of data shuffling involving multiple computations, a critical challenge is to minimize this charge depletion to avoid errors in the operand voltage during successive computations, which can be circumvented using a modified charge-based MP-structure where the diode is replaced with an NMOS transistor connected to the supply as shown in FIGS. 27A and 27B. In this case, when the operand inputs are shuffled to different MP compute inputs, the charge on input operands is maintained, avoiding charge leakage in the input capacitors.

With 2 fF CC,i, improvement of ~14 dB in hardware dynamic range through data shuffling thus enabling to meet the desired hardware dynamic range metric. By way of a non-limiting example, an estimated 25 data-shuffle computations may be required to average the capacitor mismatches. Additionally, or alternatively, the Ai and Bi inputs may be modulated using Walsh-function sequences. In this case, $z_{out} = (z^+ - z^-) \rightarrow R_{p \cdot A \leftrightarrow q \cdot B}$ where p and q are WF-seq as shown in FIG. 27A and FIG. 27B. Multiplying the output, $z_{out}$ by p·q (another WF-seq) can recover $R_{A \leftrightarrow B}$, mitigating degradation due to mismatch and noise in the computing hardware.

FIG. 28 illustrates device level implementation and optimization of MP-compute according to embodiments as described in the present disclosure. In FIG. 28, a basic MP-compute array comprising of diodes and capacitors is shown. Additionally, an implementation of the back-to-back diodes and coupling capacitor using a pMOS transistor in a bulk CMOS and in a FD-SOI process is also shown. An example layout showing integration of the pMOS devices to form an MP-compute array is also shown in FIG. 28.

In some embodiments, different CMOS compatible device structures may be used to improve the throughput and the energy-efficiency of MP-compute. Specifically, the construction and the dynamics of charged-coupled arrays may be used to enable high-density integration, and to implement large length correlators. In some embodiments, by way of a non-limiting example, the basic MP-compute circuit as shown in FIG. 28 may include back-to-back diodes connected to the two inputs Xi and Yi and the coupling capacitor may be implemented using a single floating n-well pMOS device, as shown in FIG. 28, for a bulk-CMOS process and for a fully depleted Silicon-on-insulator process. Charge conservation on the node Z can then be easily achieved by connecting the polysilicon gate along a column according to a layout shown in FIG. 28. This array structure can be extended to multiple inputs across multiple columns. By way of a non-limiting example, to derive the energy-efficiency benefit of resonant or charge-mode computing, the settling time of the MP-compute array needs to be comparable or smaller than the desired sampling rate. The setting time could be improved by using Schottky junctions as diodes, which would result in even higher integration/ computational densities.

Figures 29A, 29B:
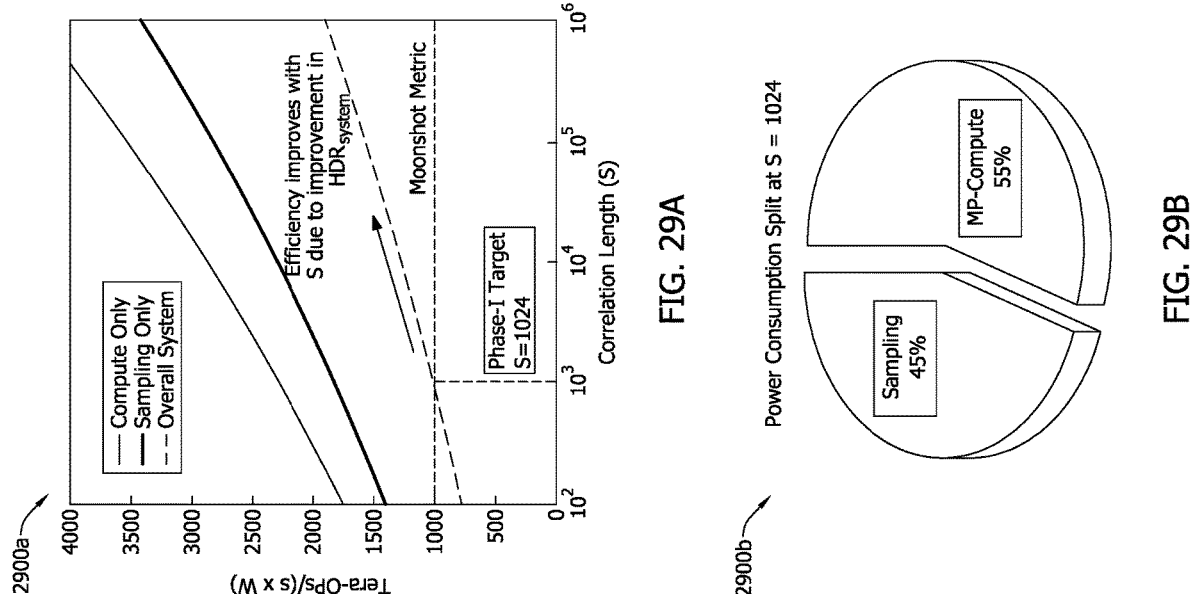
FIG. 29A illustrates power efficiency of the compute block, sampling/delay block, and the overall system according to embodiments as described in the present disclosure.
FIG. 29B illustrates the power consumption split between the sub-blocks within the analog correlator with a correlation length S=1024 according to embodiments as described in the present disclosure.

FIG. 29A illustrates a graph 2900a corresponding to power efficiency of the compute block, sampling/delay block, and the overall system according to embodiments as described in the present disclosure. FIG. 29B illustrates the power consumption split 2900b between the sub-blocks within the analog correlator with a correlation length S=1024 according to embodiments as described in the present disclosure.

In some embodiments, to realize an ultra-efficient ultra-precise fully analog correlator based on charge-based MP-computation, the analog input signals are passed through switched capacitor based analog delays and then sampled onto time-interleaved capacitors, thus creating delayed versions of the input signals. In order to achieve power-efficient delay generator, two switched capacitor sampler architectures namely, (i) cascaded N-path switched capacitor delays based on resonant charge transfer, and (ii) tree-distribution based N-path samplers, may be evaluated. The outputs from these voltage samplers are stacked and reverse staked to realize the addition and subtraction operations that are required to generate the operands for the MP-computation. These operands are then multiplied with Walsh-codes to further enhance the hardware dynamic range of the computation by suppressing the device non-idealities such as mismatches, noise, and non-linearity. The Walsh coded input operands are fed into the charge-based MP-compute block that outputs the predicted correlation between the input vectors in form of a differential voltage at the output of the MP-compute block.

In some embodiments, the overall power consumption of the MP-based analog correlator can be the sum of the power consumption of the delay/sampling block and the MP-compute block. The power-efficiencies of MP-compute and delay/sampling block are estimated using Eqs. 10 and 11. Finally, the energy efficiency of the overall systems can be estimated to be as shown in Eq. 12 below.

$$\left(\frac{TOPs}{s \times w}\right)_{system} = \cfrac{1}{\cfrac{1}{\left(\frac{TOPs}{s \times w}\right)_{compute}} + \cfrac{1}{\left(\frac{TOPs}{s \times w}\right)_{sampling}}} \qquad \text{Eq. 12}$$

Using the parasitic estimates of Intel 22 nm FL process, the power-efficiency of the analog correlator may be calculated as shown in FIG. 29A and 2900a and FIG. 29B as 2900b, which depicts the usage of just the switches and the capacitors with no inductive elements may results in a small overall chip area for the analog correlator. By way of a non-limiting example, the analog correlator may have a chip area<1 mm$^2$ including the sampling capacitors.

In some embodiments, efficiency (TOPs/W) may be achieved using the charge-based MP correlator that has no current static current, and, therefore, inherently results in high energy efficiency. Additionally, a resonant charge-transfer architecture, as described in the present disclosure, recycle the charge stored on the compute capacitors thus further improving the overall efficiency of the MP computation. On the sampling side, an ultra-efficient tree-distribution based capacitor sampling is used to realize extremely large delays with low power consumption and complexity.

In some embodiments, a dynamic range metric is achieved using the charge-based MP-compute block that improves with the correlator length. Accordingly, high correlators lengths may be achieved that inherently result in superior hardware dynamic range. Additionally, the concepts of data-shuffling and Walsh-coding schemes may be implemented to reduce the effect of device mismatches. By way of a non-limiting example, in some embodiments, in order to achieve high signal processing gains, the charge-based MP-correlator can be cascaded with a charge-based MP-adder thus realizing a MP correlate-accumulate architecture.

A practical limitation of scaling the MP-correlator to correlation lengths>10,000 is overcome using the routing capacitance at the output node. Additionally, or alternatively, instead of diode-capacitance based MP-correlators, dynamics of charged-coupled arrays that can enable high-density integration may be used to implement large length correlators. Additionally, or alternatively, a MP-correlate-Accumulate architecture where the MP-correlator is cascaded with an MP-adder may be used to realize large correlation lengths.

The computer-implemented methods discussed herein may include additional, less, or alternate actions, including those discussed elsewhere herein. The methods may be implemented via one or more local or remote processors, transceivers, servers, and/or sensors (such as processors, transceivers, and/or servers), and/or via computer-executable instructions stored on non-transitory computer-readable media or medium. Additionally, the computer systems discussed herein may include additional, less, or alternate functionality, including that discussed elsewhere herein. The computer systems discussed herein may include or be implemented via computer-executable instructions stored on non-transitory computer-readable media or medium.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A non-multiply-accumulate (non-MAC) charge-based analog correlator system comprising:
    a sampler circuit block configured to sample a plurality of input analog signals;
    an operand generation circuit block configured to generate operands based on the sampled plurality of input analog signals; and
    a margin propagation (MP) correlation computation circuit block for the non-multiply-accumulate (non-MAC) charge-based analog correlator system, wherein the MP correlation computation circuit block is configured to:
    generate correlated output signals based on the operands and using calculations in a charge domain; and
    implement a rectifying-linear-unit (ReLU)-based MP function.

2. The non-MAC charge-based analog correlator system of claim 1, wherein the operand generation circuit block comprises a plurality of stacked capacitors configured to generate the operands.

3. The non-MAC charge-based analog correlator system of claim 1, wherein the operand generation circuit block is configured to generate quadrant operands, and the MP correlation computation circuit block is configured to generate the correlated output signals based on the quadrant operands.

4. The non-MAC charge-based analog correlator system of claim 1, wherein the sampler circuit block is further configured to generate analog delay in the sampled plurality of input analog signals.

5. The non-MAC charge-based analog correlator system of claim 4, wherein the sampler circuit block comprises cascaded delay elements configured to generate the analog delay.

6. The non-MAC charge-based analog correlator system of claim 4, wherein the sampler circuit block is configured to generate the analog delay based on tree distribution.

7. The non-MAC charge-based analog correlator system of claim 1, wherein the sampler circuit block comprises a 2-layer circuit configured to process a phase of the input analog signals.

8. The non-MAC charge-based analog correlator system of claim 1, wherein the margin propagation (MP) correlation computation circuit block includes a signal path and a charge transfer path.

9. The non-MAC charge-based analog correlator system of claim 8, wherein the signal path is separate from the charge transfer path.

10. The non-MAC charge-based analog correlator system of claim 1, wherein the input analog signals correspond with radar signals, code division communication signals, or spectrum sensing signals.

11. The non-MAC charge-based analog correlator system of claim 1, wherein the non-MAC charge-based analog correlator system is an integrated circuit (IC) implemented in a complementary metal oxide semiconductor (CMOS).

12. A method, comprising:

generating a non-multiply-accumulate (non-MAC) charge-based analog correlator system comprising a sampler circuit block, an operand generation circuit block, and a margin propagation (MP) correlation computation circuit block;

configuring the sampler circuit block to sample a plurality of input analog signals;

configuring the operand generation circuit block to generate operands based on the sampled plurality of input analog signals; and configuring the MP correlation computation circuit block to:

generate correlated output signals based on the operands and using calculations in a charge domain; and implement a rectifying-linear-unit (ReLU)-based MP function.

13. The method of claim 12, further comprising configuring the sampler circuit block to include a 2-layer circuit for processing each phase of an input analog signal of the input analog signals.

14. The method of claim 12, further comprising configuring a clock signal generator to generate a clock signal as a multi-phase non-overlapping clock signal.

15. The method of claim 12, further comprising configuring the operand generation circuit block to include a plurality of stacked capacitors.

16. The method of claim 12, further comprising:

configuring the MP correlation computation circuit block to include a signal path and a charge transfer path; and configuring the MP correlation computation circuit block to correlate an input analog signal of the input analog signals, and wherein the signal path is separate from the charge transfer path.

17. The method of claim 12, further comprising implementing the non-MAC charge-based analog correlator system as an integrated circuit (IC) using a complementary metal oxide semiconductor (CMOS).

18. The method of claim 12, further comprising configuring the sampler circuit block to generate analog delay in the sampled plurality of input analog signals.

19. The method of claim 18, wherein the sampler circuit block comprises cascaded delay elements configured to generate the analog delay.

* * * * *